US011195644B2

(12) United States Patent
Wang et al.

(10) Patent No.: US 11,195,644 B2
(45) Date of Patent: Dec. 7, 2021

(54) IRON NITRIDE MAGNETIC MATERIAL INCLUDING COATED NANOPARTICLES

(71) Applicants:Regents of the University of Minnesota, Minneapolis, MN (US); UT-BATTELLE, LLC, Oak Ridge, TN (US); UNIVERSITY OF TENNESSEE RESEARCH FOUNDATION, Knoxville, TN (US)

(72) Inventors: Jian-Ping Wang, Shoreview, MN (US); Yanfeng Jiang, Minneapolis, MN (US); Craig A. Bridges, Knoxville, TN (US); Michael Brady, Oak Ridge, TN (US); Orlando Rios, Knoxville, TN (US); Roberta A. Meisner, Knoxville, TN (US); Lawrence F. Allard, Knoxville, TN (US); Edgar Lara-Curzio, Lenoir City, TN (US); Shihai He, Fremont, CA (US)

(73) Assignees: REGENTS OF THE UNIVERSITY OF MINNESOTA, Minneapolis, MN (US); UT-BATTELLE, LLC, Oak Ridge, TN (US); UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 950 days.

(21) Appl. No.: 15/129,439

(22) PCT Filed: Mar. 26, 2015

(86) PCT No.: PCT/US2015/022763
§ 371 (c)(1),
(2) Date: Sep. 27, 2016

(87) PCT Pub. No.: WO2015/148810
PCT Pub. Date: Oct. 1, 2015

(65) Prior Publication Data
US 2017/0186518 A1 Jun. 29, 2017

Related U.S. Application Data

(60) Provisional application No. 61/971,730, filed on Mar. 28, 2014.

(51) Int. Cl.
*H01F 1/00* (2006.01)
*H01F 1/047* (2006.01)
(Continued)

(52) U.S. Cl.
CPC ............ *H01F 1/047* (2013.01); *B22F 1/0018* (2013.01); *C22C 38/001* (2013.01);
(Continued)

(58) Field of Classification Search
CPC ........ H01F 1/065; H01F 1/047; H01F 1/0054; H01F 1/147; H01F 1/06; H01F 1/061;
(Continued)

(56) References Cited

U.S. PATENT DOCUMENTS 5,032,947 A 7/1991 Li et al.
5,068,147 A 11/1991 Hori et al.
(Continued)

FOREIGN PATENT DOCUMENTS

CN 1156516 A 8/1997
CN 1621549 A 6/2005
(Continued)

OTHER PUBLICATIONS

Machine translation of JPH0582326A, 4 pages. (Year: 1993).*
(Continued)

*Primary Examiner* — Matthew E. Hoban
*Assistant Examiner* — Lynne Edmondson
(74) *Attorney, Agent, or Firm* — BakerHostetler

(57) ABSTRACT

The disclosure describes techniques for forming nanoparticles including $Fe_{16}N_2$ phase. In some examples, the nanoparticles may be formed by first forming nanoparticles including iron, nitrogen, and at least one of carbon or boron. The carbon or boron may be incorporated into the nanoparticles such that the iron, nitrogen, and at least one of carbon or boron are mixed. Alternatively, the at least one of carbon or boron are mixed. Alternatively, the at least one of carbon
(Continued)

or boron may be coated on a surface of a nanoparticle including iron and nitrogen. The nano particle including iron, nitrogen, and at least one of carbon or boron then may be annealed to form at least one phase domain including at least one of $Fe_{16}N_2$, $Fe_{16}(NB)_2$, $Fe_{16}(NC)_2$, or $Fe_{16}(NCB)_2$.

15 Claims, 10 Drawing Sheets

(51) Int. Cl.
| | |
|---|---|
| H01F 1/06 | (2006.01) |
| C23C 14/06 | (2006.01) |
| C23C 14/58 | (2006.01) |
| C23C 8/34 | (2006.01) |
| B22F 1/00 | (2006.01) |
| C22C 38/00 | (2006.01) |
| C23C 14/18 | (2006.01) |
| H01F 41/02 | (2006.01) |
| C23C 14/00 | (2006.01) |
| C23C 14/16 | (2006.01) |
| C23C 14/34 | (2006.01) |
| C23C 14/56 | (2006.01) |

(52) U.S. Cl.
CPC ........ *C22C 38/002* (2013.01); *C23C 14/0036* (2013.01); *C23C 14/0605* (2013.01); *C23C 14/165* (2013.01); *C23C 14/185* (2013.01); *C23C 14/3414* (2013.01); *C23C 14/3464* (2013.01); *C23C 14/566* (2013.01); *C23C 14/568* (2013.01); *C23C 14/5806* (2013.01); *C23C 14/586* (2013.01); *H01F 1/0054* (2013.01); *H01F 1/065* (2013.01); *H01F 41/0253* (2013.01); *C22C 2202/02* (2013.01)

(58) Field of Classification Search
CPC ... H01F 41/22; H01F 10/126; C23C 14/0036; C23C 14/0605; C23C 14/165; C23C 14/185; C23C 14/3414; C23C 14/3464; C23C 14/566; C23C 14/586; C23C 14/228; C23C 14/34; C23C 16/34; C23C 16/36; C23C 16/448; C23C 8/26; C23C 8/34; B22F 1/0018; B22F 2201/016; C01P 2006/42; C01P 2004/64; C01P 2004/62
USPC ....... 252/62.55, 62.51 R; 148/306, 105, 230; 420/121
See application file for complete search history.

(56) References Cited

U.S. PATENT DOCUMENTS

| | | | |
|---|---|---|---|
| 5,137,588 A | 8/1992 | Wecker et al. | |
| 5,330,554 A | 7/1994 | Koyano et al. | |
| 5,449,417 A | 9/1995 | Shimizu et al. | |
| 6,139,765 A | 10/2000 | Kitazawa et al. | |
| 6,217,672 B1 | 4/2001 | Zhang | |
| 6,319,485 B1 | 11/2001 | Nagatomi et al. | |
| 6,457,629 B1 | 10/2002 | White | |
| 6,778,358 B1 | 8/2004 | Jiang et al. | |
| 6,841,259 B1 | 1/2005 | Takahashi et al. | |
| 7,238,439 B2 | 7/2007 | Sasaki et al. | |
| 9,994,949 B2* | 6/2018 | Brady | C23C 28/322 |
| 10,002,694 B2* | 6/2018 | Wang | H01F 1/0302 |
| 10,072,356 B2* | 9/2018 | Wang | C23C 8/26 |
| 10,504,640 B2* | 12/2019 | Wang | B22F 9/04 |
| 10,562,103 B2* | 2/2020 | Wang | B22F 9/04 |
| 10,573,439 B2* | 2/2020 | Wang | C23C 16/56 |
| 2002/0117102 A1 | 8/2002 | Takahashi et al. | |
| 2002/0191354 A1 | 12/2002 | Yoshikawa et al. | |
| 2002/0197530 A1 | 12/2002 | Tani et al. | |
| 2004/0247859 A1 | 12/2004 | Sasaki et al. | |
| 2005/0158585 A1* | 7/2005 | Takahashi | B32B 15/01 428/836.2 |
| 2005/0208320 A1 | 9/2005 | Masada et al. | |
| 2006/0105170 A1 | 5/2006 | Dobson et al. | |
| 2006/0112873 A1 | 6/2006 | Uchida et al. | |
| 2008/0166584 A1 | 7/2008 | Deligianni et al. | |
| 2009/0042063 A1 | 2/2009 | Inoue et al. | |
| 2009/0087688 A1 | 4/2009 | Masaki | |
| 2009/0239378 A1 | 9/2009 | Kashefizadeh et al. | |
| 2010/0035086 A1 | 2/2010 | Inoue et al. | |
| 2010/0104767 A1 | 4/2010 | Sskuma et al. | |
| 2010/0288964 A1 | 11/2010 | Pirich et al. | |
| 2011/0059005 A1 | 3/2011 | Sankar et al. | |
| 2011/0074531 A1 | 3/2011 | Yamashita et al. | |
| 2011/0151281 A1* | 6/2011 | Inoue | G11B 5/70626 428/846 |
| 2012/0012778 A1* | 1/2012 | Tilley | H01F 1/0054 252/62.55 |
| 2012/0090543 A1 | 4/2012 | Cheong | |
| 2012/0145944 A1 | 6/2012 | Komuro et al. | |
| 2012/0153212 A1 | 6/2012 | Liu | |
| 2013/0126775 A1 | 5/2013 | Abe et al. | |
| 2013/0140076 A1 | 6/2013 | Lee et al. | |
| 2014/0001398 A1 | 1/2014 | Takahashi et al. | |
| 2014/0008446 A1 | 1/2014 | Carr | |
| 2014/0290434 A1 | 10/2014 | Matthiesen | |
| 2014/0299810 A1 | 10/2014 | Wang et al. | |
| 2015/0380135 A1 | 12/2015 | Wang et al. | |
| 2015/0380158 A1 | 12/2015 | Brady et al. | |
| 2016/0042846 A1 | 2/2016 | Wang et al. | |
| 2016/0042849 A1 | 2/2016 | Wang et al. | |
| 2016/0141082 A1 | 5/2016 | Wang et al. | |
| 2016/0189836 A1 | 6/2016 | Takahashi et al. | |

FOREIGN PATENT DOCUMENTS

| | | |
|---|---|---|
| CN | 102576591 A | 7/2012 |
| CN | 103268799 A | 8/2013 |
| CN | 103339694 A | 10/2013 |
| CN | 103827986 A | 5/2014 |
| CN | 105849834 A | 6/2014 |
| EP | 0509361 A2 | 10/1992 |
| EP | 0633581 A1 | 1/1995 |
| EP | 0994493 A2 | 4/2000 |
| EP | 1548760 A2 | 6/2005 |
| EP | 1675133 A2 | 6/2006 |
| EP | 2492927 A1 | 8/2012 |
| EP | 2666563 A1 | 11/2013 |
| EP | 2696356 A1 | 2/2014 |
| JP | S61143557 A | 7/1986 |
| JP | S61157634 A | 7/1986 |
| JP | S62232101 A | 10/1987 |
| JP | S63132701 A | 6/1988 |
| JP | H02173209 A | 7/1990 |
| JP | H02212320 A | 8/1990 |
| JP | H03100124 A | 4/1991 |
| JP | H04217305 A | 8/1992 |
| JP | H08 78701 A | 3/1993 |
| JP | H05 82326 A | 4/1993 |
| JP | H05269503 A | 10/1993 |
| JP | H05311390 A | 11/1993 |
| JP | H05326239 A | 12/1993 |
| JP | H0696947 A | 4/1994 |
| JP | H06267722 A | 9/1994 |
| JP | H06311390 A | 11/1994 |
| JP | 2000176513 A | 6/2000 |
| JP | 2001135508 A | 5/2001 |
| JP | 2001176715 A | 6/2001 |
| JP | 2002334695 A | 11/2002 |
| JP | 2004319923 A | 11/2004 |
| JP | 2005183932 A | 7/2005 |
| JP | 2006155894 A | 6/2006 |
| JP | 2007070669 A | 3/2007 |
| JP | 2007273038 A | 10/2007 |
| JP | 2008311518 A | 12/2008 |
| JP | 2009259402 A | 11/2009 |
| JP | 2012190156 A | 10/2012 |

(56) References Cited

FOREIGN PATENT DOCUMENTS

| | | |
|---|---|---|
| JP | 2012193409 A | 10/2012 |
| JP | 2012246174 A | 12/2012 |
| JP | 2013069926 A | 4/2013 |
| JP | 2013080922 A | 5/2013 |
| JP | 2013102122 A | 5/2013 |
| KR | 1020120091091 A | 8/2012 |
| TW | 272293 B | 3/1996 |
| TW | I303072 B | 11/2008 |
| TW | 201249564 A | 12/2012 |
| TW | 201447934 A | 12/2014 |
| WO | WO 2011049080 A1 | 4/2011 |
| WO | WO 2012159096 A2 | 11/2012 |
| WO | WO 2013026007 A2 | 2/2013 |
| WO | WO 2013042721 A1 | 3/2013 |
| WO | WO 2013090895 A1 | 6/2013 |
| WO | WO 2014124135 A2 | 8/2014 |
| WO | 2014210027 A1 | 12/2014 |
| WO | WO 2014210027 A1 | 12/2014 |
| WO | 2015148810 A1 | 10/2015 |
| WO | 2016022685 A1 | 2/2016 |
| WO | 2016022711 A1 | 2/2016 |
| WO | 2016122971 A1 | 8/2016 |
| WO | 2016122987 A1 | 8/2016 |
| WO | 2016122712 A1 | 8/2017 |

OTHER PUBLICATIONS

Espacenet machine translation of JPH0582326A with Japanese disclosure, 7 pages. (Year: 1993).*
JPO machine translation of JPH0582326A, 4 pages. (Year: 1993).*
Shihai, "Synthesis of Hard Magnetic Nanoparticles for Applications in Permanent Magnets", Dissertation University of Minnesota, Dec. 1, 2014, pp. 1-157.
Examination Report from counterpart Australian Application No. 2015235987, dated Nov. 2, 2016, 3 pp.
Examination Report from counterpart Canadian Application No. 2,944,373, dated Nov. 17, 2016, 5 pp.
Notification of Office Action and Search Report, and translation thereof, from counterpart Korean Application No. 10-2016-7030121, dated Jan. 17, 2017, 8 pp.
The Notification of Reason for Rejection, and translation thereof, from counterpart Japanese Application No. 2016-563181, dated Mar. 14, 2017, 9 pp.
Turgut et al., "Thermal Plasma Synthesis of ?-FeN, Nanoparticles as Precursors for the Fe16N2 Synthesis by Annealing," ResearchGate, MRS Online Proceeding Library Jan. 2011, 7 pp.
Slater, "Electronic Structure of Alloys," Journal of Applied Physics, vol. 8, No. 6, Jun. 1937, 8 pp.
Kikkawa et al., "Fine Fe16N2 powder prepared by low-temperature nitridation," Materials Research Bulletin, vol. 43, ScienceDirect, Feb. 19, 2008, 8 pp.
Zayak et al., "First-principles investigations of homogenous lattice-distortive strain and shuffles in Ni2MnGA," Journal of Physics: Condensed Matter, vol. 15, No. 2, Jan. 22, 2003, 8 pp.
Bogaerts et al., "Monte Carlo simulation of an analytical glow discharge: motion of electrons, ions and fast neutrals in the cathode dark space," Spectrochimica Acta, vol. 50B, No. 1, Jan. 1995, 20 pp.
Gagnoud et al., "Electromagnetic Modelling of Induction Melting Devices in Cold Crucible," IEEE Transactions on Magnetics, vol. 24, No. 1, Jan. 1988, 5 pp.
Sakuma, "Electronic and Magnetic Structure of Iron Nitride, Fe16N2 (invited)," Journal of Applied Physics, vol. 79, No. 8, Apr. 15, 1996, 8 pp.
Resta, "Ab initio study of tetragonal variants in Ni2MnGa alloy," Journal of Physics: Condensed Matter, vol. 14, No. 20, May 27, 2002, 14 pp.
Becke, "Density-Functional Exchange-Energy Approximation With Correct Asymptotic Behavior," Physical Review A General Physics, vol. 38, No. 6, Sep. 15, 1988, 4 pp.

Floris et al., "Vibrational Properties of MnO and NiO from DFT + U-Based Density Functional Perturbation Theory," Physical Review B Condensed Matter, vol. 84, Oct. 2011, 6 pp.
Liechtenstein et al., "Density-Functional Theory and Strong Interactions: Orbital Ordering in Mott-Hubbard Insulators," Physical Review B Condensed Matter, vol. 52, No. 8, Aug. 15, 1995, 5 pp.
Vasil'Ev et al., "Structural and Magnetic Phase Transitions in Shape-Memory Alloys Ni2+xMn1—xGa," Physical Review B: Condensed Matter and Materials Physics, vol. 59. No. 2, Jan. 1, 1999, pp. 1113-1120.
Sozinov et al., "Crystal Structures and Magnetic Anisotropy Properties of Ni—Mn—Ga Martensitic Phases With Giant Magnetic-Field-Induced Strain," IEEE Transactions on Magnetics, vol. 38, No. 5, Sep. 2002, pp. 2814-2816.
Zayak et al., "Switchable Ni—Mn—Ga Heusler nanocrystals," Journal of Applied Physics vol. 104, No. 7, Oct. 2008, 6 pp.
Likhachev et al., "Modeling the Strain Response, Magneto-Mechanical Cycling Under the External Stress, Work Output and Energy Losses in Ni—Mn—Ga," Mechanics of Materials, vol. 38, May 2006 pp. 551-563.
Morisako et al., "Magnetic Anisotropy and Soft Magnetism of Iron Nitride Thin Films Prepared by Facing-Target Sputtering," Journal of Applied Physics, vol. 69, No. 8, Apr. 15, 1991, pp. 5619-5621.
Jordan et al., "Magnetic Fluid Hyperthermia (MFH): Cancer Treatment with AC Magnetic Field Induced Excitation of Biocompatible Superparamagnetic Nanoparticles," Journal of Magnetism and Magnetic Materials vol. 201, Jul. 1, 1999 pp. 413-419.
Chakrabarti et al., "Influence of Ni Doping on the Electronic Structure of Ni2MnGa," Physical Review B vol. 72, Aug. 5, 2005, 4 pp.
Kirby et al., "Anomalous ferromagnetism in TbMnO3 thin films," Journal of Applied Physics, vol. 105, No. 7, Apr. 2009, 5 pp.
"2014 Titans of Technology—Jian-Ping Wang," Minneapolis/St. Paul Business Journal, Sep. 19, 2014, 18 pp.
Brady et al., "The Formation of Protective Nitride Surfaces for PEM Fuel Cell Metallic Bipolar Plates," Journal of the Minerals, Aug. 2006, pp. 50-57.
Himmetoglu, et al., "First-Principles Study of Electronic and Structural Properties of CuO," Physical Review B. vol. 84, Sep. 14, 2011, 8 pp.
Wedel et al., "Low Temperature Crystal Structure of Ni—Mn—Ga Alloys," Journal of Alloys and Compounds, vol. 290, Aug. 30, 1999 pp. 137-143.
Min, "Enhancement of Fe Magnetic Moments in Ferromagnetic Fe16B2, Fe16C2, and Fe16N2," International Journal of Modern Physics B. vol. 7, No. 1-3, Jan. 1993, pp. 729-732.
Bozorth, "Atomic Moments of Ferromagnetic Alloys," The Physical Review, vol. 79, No. 5, Sep. 1, 1950. pp. 887.
Rong et al., "Fabrication of Bulk Nanocomposite Magnets via Severe Plastic Deformation and Warm Compaction," Applied Physics Letters, vol. 96, No. 10, Mar. 8, 2010, 3 pp.
Lorenz et al., "Precise Determination of the Bond Percolation Thresholds and Finite-Size Scaling Corrections for the sc, fcc, and bcc Lattices," Physical Review E, vol. 57, No. 1, Jan. 1998, pp. 230-236.
Majkrzak, "Polarized Neutron Reflectometry," Physica B: Condensed Matter, vol. 173, No. 1 & 2, Aug. 1991, 16 pp.
Opeil et al., "Combined Experimental and Theoretical Investigation of the Premartensitic Transition in Ni2MnGa," Physical Review Letters, vol. 100, Apr. 25, 2008, 4 pp.
Gao et al., "Quantitative Correlation of Phase Structure With the Magnetic Moment in rf Sputtered Fe—N Films," Journal of Applied Physics, vol. 73, No. 10, May 15, 1993, pp. 6579-6581.
Ortiz et al., "Epitaxial Fe16N2 Films Grown by Sputtering," Applied Physics Letters, vol. 65. No. 21, Nov. 21, 1994, pp. 2737-2739.
Cheng et al., "Tempering of Iron-Carbon-Nitrogen Martensites," Metallurgical Transactions A: Physical Metallurgy and Materials Science, vol. 23A, No. 4, Apr. 1992, pp. 1129-1145.
Chikazumi, "Physics of Ferromagnetism," Oxford Science Publications, Ed. 2, 1999, pp. 199-203. (Applicant points out, in accordance with MPEP 609.04(a), that the year of publication, 1999, is sufficiently earlier than the effective U.S. filing date, Mar. 28, 2014, so that the particular month of publication is not in issue.).

(56) References Cited

OTHER PUBLICATIONS

Wehrenberg et al., "Shock Compression Response of α"—Fe16N2 Nanoparticles," Journal of Applied Physics, vol. 111, No. 8, Apr. 23, 2012, 8 pp.
Ceperley et al., "Ground State of the Electron Gas by a Stochastic Method," Physical Review Letters, vol. 45, No. 7, Aug. 18, 1980, pp. 566-569.
Borsa et al., "Phase Identification of Iron Nitrides and Iron Oxy-Nitrides with Mössbauer Spectroscopy," Hyperfine Interactions, vol. 151/152, Dec. 2003, pp. 31-48.
Cook, "Strain Induced Martensite Formation in Stainless Steel," Metallurgical Transactions A, vol. 18A, No. 2, Feb. 1987, pp. 201-210.
Sun et al., "Epitaxial Single Crystal Fe16N2 Films Grown by Facing Targets Sputtering," Journal of Applied Physics, vol. 79, No. 8, Apr. 15, 1996, pp. 5440-5442.
Ping et al., "Partitioning of Ga and Co Atoms in a Fe3B/Nd2Fe14B Nanocomposite Magnet," Journal of Applied Physics, vol. 83, No. 12, Jun. 15, 1998, pp. 7769-7775.
Scherlis et al., "Simulation of Heme Using DFT + U: A Step Toward Accurate Spin-State Energetics," The Journal of Physical Chemistry, vol. 111, No. 25, Apr. 21, 2007, pp. 7384-7391.
Jugovic et al., "A Review of Recent Developments in the Synthesis Procedures of Lithium Iron Phosphate Powders," Journal of Power Sources, vol. 190, Feb. 6, 2009, pp. 538-544.
Fullerton et al., "Structure and Magnetic Properties of Exchange-Spring Sm—Co/Co Superlattices," Applied Physics Letters vol. 72, No. 3, Jan. 19, 1998, pp. 380-382.
Van Voorthuysen et al., "Low-Temperature Extension of the Lehrer Diagram and the Iron-Nitrogen Phase Diagram," Metallurgical and Materials Transactions A: Physical Metallurgy and Materials Science, vol. 33A, No. 8, Aug. 2002, pp. 2593-2598.
Kita et al., "Magnetic Properties of Core-Shell Type Fe16N2 Nanoparticles," Journal of Magnetism and Magnetic Materials, vol. 310, Nov. 21, 2006, pp. 2411-2413.
Kneller et al., "The Exchange-Spring Magnet: A New Material Principle for Permanent Magnets," IEEE Transaction on Magnetics, vol. 27, No. 4, Jul. 1991, pp. 3588-3600.
Lavernia et al., "The Rapid Solidification Processing of Materials: Science, Principles, Technology, Advances, and Applications," Journal of Material Science, vol. 45, Dec. 1, 2009, pp. 287-325.
Casoli et al., "Exchange-Coupled FePt/Fe Bilayers with Perpendicular Magnetization," IEEE Transactions on Magnetics, vol. 41, No. 10, Oct. 2005, pp. 3877-3879.
Zhou et al., "Phase Separation in LixFePO4 Induced by Correlation Effects," Physical Review B, vol. 69, May 12, 2004, 4 pp.
Zhou et al., "First-Principles Prediction of Redox Potentials in Transition-Metal Compounds with LDA+U," Physical Review B. vol. 70, Dec. 20, 2004, 8 pp.
Zhou et al., "The Li Intercalation Potential of LiMPO4 and LiMSiO4 Olivines with M=Fe, Mn, Co, Ni," Electrochemistry Communications, vol. 6, Sep. 25, 2004, pp. 1144-1148.
Zhou et al., "Configurational Electronic Entropy and the Phase Diagram of Mixed-Valence Oxides: The Case of LixFePO4," Physical Review Letters, vol. 97, Oct. 13, 2006, 4 pp.
Herzer, "Grain Size Dependence of Coercivity and Permeability in Nanocrystalline Ferromagnets," IEEE Transactions on Magnetics, vol. 26, No. 5, Sep. 1990, pp. 1397-1402.
Ludtka et al., "In Situ Evidence of Enhanced Transformation Kinetics in a Medium Carbon Steel Due to a High Magnetic Field," Scripta Materialia, vol. 51, Apr. 20, 2004, pp. 171-174.
Felcher, "Neutron Reflection as a Probe of Surface Magnetism," Physical Review B: Condensed Matter, vol. 24, No. 3, Aug. 1, 1981, pp. 1595-1598.
Speich et al., "Elastic Constants of Binary Iron-Base Alloys," Metallurgical Transactions, vol. 3, No. 8, Aug. 1972, pp. 2031-2037.
Fernando et al., "Magnetic Moment of Iron in Metallic Environments," Physical Review B, vol. 61, No. 1, Jan. 1, 2000, pp. 375-381.
Felcher, "Magnetic Depth Profiling Studies by Polarized Neutron Reflection," Physica B: Condensed Matter, vol. 192, Nos. 1 & 2, Oct. 1993, pp. 137-149.
Gaunt, "The Magnetic Properties of Platinum Cobalt Near the Equiatomic Composition Part II. Mechanism of Magnetic Hardening," The Philosophical Magazine, vol. 13, No. 123, Mar. 1966, pp. 579-588.
Takahashi et al., "α—Fe16N2 Problem—Giant Magnetic Moment or Not," Journal of Magnetism and Magnetic Materials, vol. 208, No. 3, Jan. 11, 2000, pp. 145-157.
Shokrollahi et al., "Soft Magnetic Composite Materials (SMCs)," Journal of Materials Processing Technology, vol. 189, Feb. 20, 2007, pp. 1-12.
Sugita et al., "Magnetic and Electrical Properties of Single-Phase, Single-Crystal Fe16N2 Films Epitaxially Grown by Molecular Beam Epitaxy (Invited)," Journal of Applied Physics, vol. 79, No. 8, Apr. 15, 1996, pp. 5576-5581.
Takahashi et al., "Perpendicular Uniaxial Magnetic Anisotropy of Fe16N2(001) Single Crystal Films Grown by Molecular Beam Epitaxy," IEEE Transactions on Magnetics, vol. 35, No. 5, Sep. 1999, pp. 2982-2984.
Tanaka et al., "Electronic Band Structure and Magnetism of Fe16N2 Calculated by the FLAPW Method," Physical Review B: Condensed Matter and Materials Physics, vol. 62, No. 22, Dec. 1, 2000, pp. 15042-15046.
Zeng et al., "Exchange-Coupled Nanocomposite Magnets by Nanoparticle Self-Assembly," Nature, vol. 420, No. 6914, Nov. 28, 2002, pp. 395-398.
Du, "A Reevaluation of the Fe—N and Fe—C—N Systems," Journal of Phase Equilibria, vol. 14, No. 6, Aug. 24, 1993, pp. 682-693.
Jiang et al., "The Thermostability of the Fe16N2 Phase Deposited on a GaAs Substrate by Ion-Bean-Assisted Deposition," Journal of Physical Condensed Matter, vol. 6, Mar. 17, 1994, pp. L279-L282.
Jan et al., "Monte Carlo Simulations of Spin—1/2 Micelle and Microemulsion Models," Journal De Physique, vol. 49, No. 4, Apr. 1988, pp. 623-633.
Nelson, "Epitaxial Growth From The Liquid State and Its Application To The Fabrication of Tunnel and Laser Diodes," RCA Review, vol. 24, No. 4, Dec. 1963, pp. 603-615.
Shinno et al., "Effects of Film Thickness on Formation Processes of Fe16N2 in Nitrogen Ion-Implanted Fe Films," Surface and Coatings Technology, vol. 103-104, May 1998, pp. 129-134.
Takahashi et al., "Ferromagnetic Resonance Studies of Fe16N2 Films with a Giant Magnetic Moment," Journal of Applied Physics, vol. 73, No. 10, May 15, 1993, pp. 6060-6062.
Shimba et al., "Preparation of Iron Nitride Fe16N2 Nanoparticles by Reduction of Iron Nitrate," J. Japan Inst. Metals, vol. 74, No. 3, 2010, 5 pp. (Applicant points out, in accordance with MPEP 609.04(a), that the year of publication, 2010, is sufficiently earlier than the effective U.S. filing date, Mar. 28, 2014, so that the particular month of publication is not in issue.).
Hook et al., "Magnetic Order," Solid State Physics, Ed. 2, Ch. 8, 1991, pp. 219-252. (Applicant points out, in accordance with MPEP 609.04(a), that the year of publication, 1991, is sufficiently earlier than the effective U.S. filing date, Mar. 28, 2014, so that the particular month of publication is not in issue.).
Hsu et al., "First-Principles Study for Low-Spin LaCoO3 with a Structurally Consistent Hubbard U," Physical Review B, vol. 79, Mar. 31, 2009, 9 pp.
Hsu et al., "Spin-State Crossover and Hyperfine Interactions of Ferric Iron in MgSiO3 Perovskite," Physical Review Letters, vol. 106, Mar. 18, 2011, 4 pp.
McCurrie, "Chapter 3: The Structure and Properties of Alinco Permanent Magnet Alloys," Handbook of Ferromagnetic Materials, vol. 3, 1982, 82 pp. (Applicant points out, in accordance with MPEP 609.04(a), that the year of publication, 1982, is sufficiently earlier than the effective U.S. filing date, Mar. 28, 2014, so that the particular month of publication is not in issue.).
Kulik et al., "Density Functional Theory in Transition-Metal Chemistry: A Self-Consistent Hubbard U Approach," Physical Review Letters, vol. 97, Sep. 8, 2006, 4 pp.

(56) References Cited

OTHER PUBLICATIONS

Bae et al., "Cost Effective Parallel-Branch Spiral Inductor with Enhanced Quality Factor and Resonance Frequency," Electronics and Telecommunications Research Institute, 2007, pp. 87-90. (Applicant points out, in accordance with MPEP 609.04(a), that the year of publication, 2007, is sufficiently earlier than the effective U.S. filing date, Mar. 28, 2014, so that the particular month of publication is not in issue.).

Galanakis et al., "Spin-Polarization and Electronic Properties of Half-Metallic Heusler Alloys Calculated from First Principles," Journal of Physics: Condensed Matter, vol. 19, No. 31, Jul. 3, 2007 (online), 16 pp.

Al-Omari et al., "Magnetic Properties of Nanostructured CoSm/FeCo Films," Physical Review B, vol. 52, No. 5, Aug. 1, 1995, pp. 3441-3447.

Mazin et al., "Insulating Gap in FeO: Correlations and Covalency," Physical Review B, vol. 55, No. 19, May 15, 1997, pp. 12822-12825.

Solovyev et al., "Corrected Atomic Limit in the Local-Density Approximation and the Electronic Structure of d Impurities in Rb," Physical Review B, vol. 50, No. 23, Dec. 15, 1994, pp. 16861-16871.

Campos et al., "Evaluation of the Diffusion Coefficient of Nitrogen in Fe4N1-x Nitride Layers During Microwave Post-Discharge Nitriding," Applied Surface Science, vol. 249, Dec. 30, 2004, pp. 54-59.

Issakov et al., "Fast Analytical Parameters Fitting of Planar Spiral Inductors," 2008 IEEE International Conference on Microwaves, Communications, Antennas and Electronic Systems, May 13-14, 2008, 10 pp.

Borchers et al., "Observation of Antiparallel Magnetic Order in Weakly Coupled Co/Cu Multilayers," Physical Review Letters, vol. 82, No. 13, Mar. 29, 1999, pp. 2796-2799.

Takahashi et al., "Structure and Magnetic Moment of $\alpha$—Fe16N2 Compound Films: Effect of Co and H on Phase Formation (Invited)," Journal of Applied Physics, vol. 79, No. 8, Apr. 15, 1996, pp. 5564-5569.

Buschbeck et al., "Full Tunability of Strain Along the fcc-bcc Bain Path in Epitaxial Films and Consequences for Magnetic Properties," Physical Review Letters, vol. 103, Nov. 20, 2009, 4 pp.

Chakhalian et al., "Magnetism at the Interface Between Ferromagnetic and Superconducting Oxides," Nature Physics, vol. 2, Apr. 1, 2006, pp. 244-248.

Cui et al., "Phase Transformation and Magnetic Anisotropy of an Iron-Palladium Ferromagnetic Shape-Memory Alloy," Acta Materialia, vol. 52, No. 1, Jan. 5, 2004, 35-47.

Davies et al., "Anisotropy Dependence of Irreversible Switching in Fe/SmCo and FeNi/FePt Exchange Spring Magnet Films," Applied Physics Letters, vol. 86, No. 26, Jun. 27, 2005, 3 pp.

Herbst et al., "Neodymium-Iron-Boron Permanent Magnets," Journal of Magnetism and Magnetic Materials, vol. 100, Nos. 1-3, Nov. 1991, pp. 57-78.

Fidler et al., "Recent Developments in Hard Magnetic Bulk Materials," Journal of Physics: Condensed Matter, vol. 16, Jan. 23, 2004, pp. 455-470.

Haenl et al., "Room-Temperature Ferroelectricity in Strain SrTiO3," Nature, vol. 430, Aug. 12, 2004, pp. 758-761.

Hoppler et al., "Giant Superconductivity-Induced Modulation of the Ferromagnetic Magnetization in a Cuprate-Manganite Superlattice," Nature Materials, vol. 8, Apr. 2009, pp. 315-319.

Coey, "The Magnetization of Bulk $\alpha$—Fe16N2 (Invited)," Journal of Applied Physics, vol. 76, No. 19, Nov. 15, 1994, pp. 6632-6636.

Coey et al., "The Magnetization of $\alpha$—Fe16N2," Journal of Physics: Condensed Matter, vol. 6, Sep. 27, 1993, pp. 23-28.

Coey, "Magic Moments in Magnetism," Physics World, vol. 6, No. 8, Aug. 1993, pp. 25-26.

Qiu et al., "Tuning the Crystal Structure and Magnetic Properties of FePt Nanomagnets," Advanced Materials, vol. 19, Jun. 6, 2007, pp. 1703-1706.

Wang, "FePt Magnetic Nanoparticles and Their Assembly for Future Magnetic Media," Proceedings of the IEEE, vol. 96, No. 11, Nov. 2008, pp. 1847-1863.

Qiu et al., "Monodispersed and Highly Ordered L10 FePt Nanoparticles Prepared in the Gas Phase," Applied Physics Letters, vol. 88, May 9, 2006, 3 pp.

Qiu et al., "In Situ Magnetic Field Alignment of Directly Ordered L10 FePt Nanoparticles," Applied Physics Letters, vol. 89, Nov. 29, 2006, 3 pp.

Liu et al., "High Energy Products in Rapidly Annealed Nanoscale Fe/Pt Multilayers," Applied Physics Letters, vol. 72, No. 4, Jan. 26, 1998, pp. 483-485.

Wang et al., "Fabrication of Fe16N2 Films by Sputtering Process and Experimental Investigation of Origin of Giant Saturation Magnetization in Fe16N2," IEEE Transactions on Magnetics, vol. 48, No. 5, May 2012, pp. 1710-1717.

Shi et al., "Diamond-Like Carbon Films Prepared by Facing-Target Sputtering," Thin Solid Films, vols. 420-421, Dec. 2, 2002, pp. 172-175.

Jiang et al., "Improving Exchange-Spring Nanocomposite Permanent Magnets," Applied Physics Letters, vol. 85, No. 22, Nov. 29, 2004, pp. 5293-5295.

Zhou et al., "Permanent-Magnet Properties of Thermally Processed FePt and FePt—Fe Multilayer Films," IEEE Transactions on Magnetics, vol. 38, No. 5, Sep. 2002, pp. 2802-2804.

Maclaren, "Role of Alloying on the Shape Memory Effect in Ni2MnGa," Journal of Applied Physics, vol. 91, No. 10, May 15, 2002, pp. 7801-7803.

Perdew et al., "Self-Interaction Correction to Density-Functional Approximations for Many-Electron Systems," Physical Review B, vol. 23, No. 10, May 15, 1981, pp. 5048-5079.

Dong et al., "Shape Memory and Ferromagnetic Shape Memory Effects in Single-Crystal Ni2MnGa Thin Films," Journal of Applied Physics, vol. 95, No. 5, Mar. 1, 2004, pp. 2593-2600.

Bland et al., "Ferromagnetic Moments in Metastable Magnetic Films by Spin-Polarized-Neutron Reflection," Physical Review Letters, vol. 58, No. 12, Mar. 23, 1987, pp. 1244-1247.

Bland et al., "Layer Selective Magnetometry in Ultrathin Magnetic Structures by Polarised Neutron Reflection," Journal of Magnetism and Magnetic Materials, vol. 165, Jun. 1997, pp. 46-51.

Ji et al., "Elemental Specific Study on FeCo—Au nanoparticles," Bulletin of the American Physical Society, APS Meeting 2010, vol. 55, No. 2, Mar. 15-19, 2010, 1 pp.

Coey, "Permanent Magnet Applications" Journal of Magnetism and Magnetic Materials, vol. 248, Apr. 24, 2002, pp. 441-456.

Zhang et al., "Polarizer angular dependence of spin transfer oscillation in magnetic tunnel junction," Bulletin of the American Physical Society, APS Meeting 2010, vol. 55, No. 2, Mar. 15-19, 2010, 1 pp.

Kronmüller et al., "Micromagnetic Analysis of the Magnetic Hardening Mechanisms in Re—Fe—B Magnets," Journal De Physique, C8, No. 12, Tome 49, Dec. 1988, 6 pp.

Tang et al., "Formation of Nanocrystalline Fe—N—B—Cu Soft Magnetic Ribbons," Journal of Non-Crystalline Solids, vol. 337, Sep. 9, 2003, pp. 276-279.

Chen et al., "Modeling of On-Chip Differential Inductors and Transformers/Baluns," IEEE Transactions on Electron Devices, vol. 54, No. 2, Feb. 2007, pp. 369-371.

Ji et al., "N Site Ordering Effect on Partially Ordered Fe16N2," Applied Physics Letters, vol. 98, No. 9, Feb. 28, 2011, 3 pp.

Ji et al., "Epitaxial High Saturation Magnetization FeN Thin Films on Fe(001) Seeded GaAs(001) Single Crystal Wafer Using Facing Target Sputterings," Journal of Applied Physics, vol. 109, No. 7, Apr. 2011, 6 pp.

Ji et al., "Theory of Giant Saturation Magnetization in $\alpha$—Fe16N2: Role of Partial Localization in Ferromagnetism of 3d Transition Metals," New Journal of Physics, vol. 12, Jun. 17, 2010, 8 pp.

Cho, "The Best Refrigerator Magnet Ever?," Science/AAAD News, Science Now, Mar. 19, 2010, retrieved from the internet http://news.sciencemag.org/physics/2010/03/best-refrigerator-magnet-ever?sms_ss=email, 2 pp.

(56) References Cited

OTHER PUBLICATIONS

Ji et al., "Perpendicular Magnetic Anisotropy and High Spin-Polarization Ratio in Epitaxial Fe—N Thin Films," Physical Review B, vol. 84, Dec. 14, 2011, 8 pp.
Ziegler, "SRIM—The Stopping and Range of Ions in Matter," retrieved from http://srim.org/ on Oct. 13, 2016, 4 pp.
Jiang et al., "FeN Foils by Nitrogen Ion-Implantation," Journal of Applied Physics, vol. 115, Mar. 12, 2014, 3 pp.
Jiang et al., "9 T High Magnetic Field Annealing Effects on FeN Bulk Sample," Journal of Applied Physics, vol. 115, Mar. 13, 2014, 3 pp.
"International Energy Outlook 2013," U.S. Energy Information Administration, Jul. 2013, 312 pp.
Croat, "Current Status of Rapidly Solidified Nd—Fe—B Permanent Magnets," IEEE Transactions on Magnetics, vol. 25, No. 5, Sep. 1989, pp. 3550-3554.
Perdew et al., "Generalized Gradient Approximation Made Simple," Physical Review Letters, vol. 77, No. 18, Oct. 28, 1996, pp. 3865-3868.
Guo et al., "A Broadband and Scalable Model for On-Chip Inductors Incorporating Substrate and Conductor Loss Effects," IEEE Radio Frequency Integrated Circuits Symposium, Jun. 12-14, 2005, pp. 593-596.
Jack, "The Occurrence and the Crystal Structure of α—Iron Nitride; A New Type of Interstitial Alloy Formed During the Tempering of Nitrogen-Martensite," Proceedings of the Royal Society of London, vol. 208, Sep. 24, 1951, pp. 216-224.
Jack, "The Iron-Nitrogen System: The Preparation and the Crystal Structures of Nitrogen-Austenite (γ) and Nitrogen-Martensite (α')*," Proceedings of the Royal Society of London, Mar. 13, 1951, pp. 200-217.
Yamanaka et al., "Humidity Effects in Fe16N2 Fine Powder Preparation by Low-Temperature Nitridation," Journal of Solid State Chemistry, vol. 183, Aug. 4, 2010, pp. 2236-2241.
Frisk, "A New Assessment of the Fe—N Phase Diagram" Calphad, vol. 11, No. 2, 1987, pp. 127-134. (Applicant points out, in accordance with MPEP 609.04(a), that the year of publication, 1987, is sufficiently earlier than the effective U.S. filing date, Mar. 28, 2014, so that the particular month of publication is not in issue.).
Nakajima et al., "Large Magnetization Induced in Single Crystalline Iron Films by High-Dose Nitrogen Implantation," Applied Physics Letters, vol. 56, No. 1, Jan. 1, 1990, pp. 92-94.
Nakajima et al., "Nitrogen-Implantation-Induced Transformation of Iron to Crystalline Fe16N2 in Epitaxial Iron Films," Applied Physics Letters, vol. 54, No. 25, Jun. 19, 1989, pp. 2536-2538.
Nakajima et al., "Formation of Ferromagnetic Iron Nitrides in Iron Thin Films by High-Dose Nitrogen Ion Implantation," Journal of Applied Physics, vol. 65, No. 11, Jun. 1, 1989, pp. 4357-4361.
Kaneko et al., "Fe—Cr—Co Ductile Magnet With (BH)max = 8 MGOe," AIP Conference Proceedings, 1976, 2 pp. (Applicant points out, in accordance with MPEP 609.04(a), that the year of publication, 1976, is sufficiently earlier than the effective U.S. filing date, Mar. 28, 2014, so that the particular month of publication is not in issue.).
Strnat, "Modern Permanent Magnets for Applications in Electro-Technology," Proceedings of The IEEE, vol. 78, No. 6, Jun. 1990, pp. 923-946.
Strnat et al., "Bonded Rare Earth-Cobalt Permanent Magnets," Proceedings of the 12$^{th}$ Rare Earth Research Conference, vol. 1, Jul. 18-22, 1976, 11 pp.
Strnat et al., "Rare Earth-Cobalt Permanent Magnets," Journal of Magnetism and Magnetic Materials, vol. 100, Nos. 1-3, Nov. 1991, pp. 38-56.
Yang et al., "The Effect of Strain Induced by Ag Underlayer on Saturation Magnetization of Partially Ordered Fe16N2 Thin Films," Applied Physics Letters, vol. 103, Dec. 12, 2013, 4 pp.
Lewis et al., "Perspectives on Permanent Magnetic Materials for Energy Conversion and Power Generation," Metallurgical and Materials Transactions A, vol. 44A, Jan. 2013, 19 pp.

Pauling, "The Nature of the Interatomic Forces in Metals," Physical Review, vol. 54, Dec. 1, 1938, pp. 899-904.
Davison et al., "Shock Compression of Solids," Physics Reports, vol. 55, No. 4, Apr. 1979, pp. 255-379.
Liu et al., "Nanocomposite Exchange-Spring Magnet Synthesized by Gas Phase Method: From Isotropic to Anisotropic," Applied Physics Letters, vol. 98, Jun. 3, 2011, 3 pp.
Liu et al., "Discovery of localized states of Fe 3D electrons in Fe16N2 and Fe8N films: an evidence of the existence of giant saturation magnetization," arXiv: 0909.4478, Sep. 2009, 13 pp.
Amato et al., "Exchange-Spring Behavior of Hard/Soft Magnetic Multilayers: Optimization Study of the Nanostructure," Physica B: Condensed Matter, vol. 275, Nos. 1-3, Jan. 2000, pp. 120-123.
Tijssens et al., "Towards an Improved Continuum Theory for Phase Transformations," Materials Science and Engineering, vol. 378, Sep. 23, 2003, pp. 453-458.
Komuro et al., "Epitaxial Growth and Magnetic Properties of Fe16N2 Films with High Saturation Magnetic Flux Density (Invited)," Journal of Applied Physics, vol. 67, No. 9, May 1, 1990, pp. 5126-5130.
Brady et al., "Alloy Design of Intermetallics for Protective Scale Formation and for use as Precursors for Complex Ceramic Phase Surfaces," Intermetallics, vol. 12, Apr. 1, 2004, pp. 779-789.
Brady et al., "Pre-Oxidized and Nitrided Stainless Steel Alloy Foil for Proton Exchange Membrane Fuel Cell Bipolar Plates: Part 1. Corrosion, Interfacial Contact Resistance, and Surface Structure," Journal of Power Sources, vol. 195, Mar. 20, 2010, pp. 5610-5618.
"Annual Energy Outlook 2015, with projects to 2040," U.S. Energy Information Administration, Apr. 2015, 154 pp.
Kim et al., "New Magnetic Material Having Ultrahigh Magnetic Moment," Applied Physics Letters, vol. 20, No. 12, Jun. 15, 1972, pp. 492-494.
Zhuge et al., "Preparation and Property of Iron Nitrides by Ball Mill Method," Journal of Functional Materials, vol. 31, No. 5, 2000, pp. 471-472 (Abstract Only (on last page)) (Applicant points out, in accordance with MPEP 609.04(a), that the year of publication, 2000, is sufficiently earlier than the effective U.S. filing date, Mar. 28, 2014, so that the particular month of publication is not in issue.).
Takahashi et al., "Magnetic Moment of α—Fe16N2 Films (Invited)," Journal of Applied Physics, vol. 76, No. 10, Nov. 15, 1994, pp. 6642-6647.
Takahashi et al., "Structure and Magnetic Moment of Fe16N2 Sputtered Film," Journal of Magnetism and Magnetic Materials, vol. 174, Nos. 1-2, Oct. 1, 1997, pp. 57-69.
Takahashi et al., "Magnetocrystalline Anisotropy for α'—Fe—C and α'—Fe—N Films," IEEE Transactions on Magnetics, vol. 37, No. 4, Jul. 2001, pp. 2179-2181.
Mühlethaler et al., "Improved Core-Loss Calculation for Magnetic Components Employed in Power Electronic Systems," IEEE Transactions on Power Electronics, vol. 27, No. 2, Feb. 2012, pp. 964-973.
Watanabe et al., "Perpendicular Magnetization of Epitaxial FePt(001) Thin Films with High Squareness and High Coercive Force," Japanese Journal of Applied Physics, vol. 35, No. 10A, Oct. 1, 1996, pp. 1264-1267.
Zhang et al., "Thermal Stability of Partially Ordered Fe16N2 Film on Non-Magnetic Ag Under Layer," Journal of Applied Physics, vol. 115, No. 17A, Mar. 20, 2014, 3 pp.
Uijttewaat et al., "Understanding the Phase Transitions of the Ni2MnGa Magnetic Shape Memory System from First Principles," Physical Review Letters, vol. 102, Jan. 23, 2009, 4 pp.
Pugaczowa-Michalska et al., "Electronic Structure and Magnetic Properties of Ni2MnGa1-xGex and Disordered Ni2MnSn Heusler Alloys," Acta Physica Polonica A, vol. 115, No. 1, Jan. 2009, pp. 241-243.
Brewer et al., "Magnetic and Physical Microstructure of Fe16N2 Films Grown Epitaxially on Si(001)," Journal of Applied Physics, vol. 81, No. 8, Apr. 15, 1997, pp. 4128-4130.
Abdellaleef et al., "Magnetic Properties and Structure of the α—Fe16N2 Films," Journal of Magnetism and Magnetic Materials, vol. 256, Nos. 1-3, Jan. 11, 2003, pp. 214-220.

(56) References Cited

OTHER PUBLICATIONS

Brewer et al., "Epitaxial Fe16N2 Films Grown on Si(001) by Reactive Sputtering," Journal of Applied Physics, vol. 79, No. 8, Apr. 15, 1996, pp. 5321-5323.

Van Genderen et al., "Atom Probe Analysis of the First Stage of Tempering of Iron-Carbon-Nitrogen Martensite," Zeitschrift Für Metallkunde, vol. 88, No. 5, May 1997, pp. 401-409.

Takahashi et al., "Impurity effect of carbon on structure and saturation magnetization of Fe—N films," Journal of Magnetism and Magnetic Materials, vol. 210, Sep. 1, 1999, pp. 333-340.

Huang et al., "Magnetism of α'—FeN Alloys and α—(Fe16N2) Fe Nitrides," Journal of Magnetism and Magnetic Materials, vol. 135, Nov. 30, 1993, pp. 226-230.

Huang et al., "Spin-Density Distribution in Ferromagnetic α—Fe16N2," Physical Review B: Condensed Matter, vol. 51, No. 5, Feb. 1, 1995, pp. 3222-3225.

Cococcioni et al., "Linear Response Approach to the Calculation of the Effective Interaction Parameters in the LDA+U Method," Physical Review B, vol. 71, Jan. 18, 2005, 16 pp.

Takahashi, "Discovery of Fe16N2 with Giant Magnetic Moment and Its Future View," IEEE Translation Journal on Magnetics in Japan, vol. 6, No. 12, Dec. 1991, pp. 1024-1038.

Zhang et al., "Strain Effect of Multilayer FeN Structure on GaAs Substrate," Journal of Applied Physics, vol. 113, No. 17, Apr. 10, 2013, 3 pp.

"New Compound Opens Way to EV Magnet without Rare Earths," Nikkei.com Morning Edition, Mar. 4, 2011, 1 pp.

Coey et al., "Magnetic nitrides," Journal of Magnetism and Magnetic Materials, vol. 200, Mar. 10, 1999, pp. 405-420.

Tomioka et al., "Iron Nitride Powder Produced as Substitute for Rare Metal," Nikkei Technology, Mar. 7, 2011, 2 pp.

Ji et al., "Direct Observation of Giant Saturation Magnetization in Fe16N2," arXiv: 1211.0553, Nov. 2012, 27 pp.

Zheng et al., "Iron Nitride Thin Films Deposited by Chloride Assisted Plasma Enhanced Chemical Vapour Deposition: Facile Stoichiometry Control and Mechanism Study," Journal of Applied Physics D: Applied Physics, vol. 42, No. 18, Sep. 21, 2009, 9 pp.

Ji et al., "Strain Induced Giant Magnetism in Epitaxial Fe16N2 Thin Film," Applied Physics Letters, vol. 102, Feb. 21, 2013, 4 pp.

Lanska et al., "Composition and Temperature Dependence of the Crystal Structure of Ni—Mn—Ga Alloys," Journal of Applied Physics, vol. 95, No. 12, Jun. 15, 2004, pp. 8074-8078.

Takahashi et al., "Growth Mechanism of FeN Films by Means of an Atmospheric Pressure Halide Chemical Vapor Deposition," Materials Chemistry and Physics, vol. 65, Jan. 18, 2000. pp. 113-116.

Ji et al., "Growth and Depth-Dependence of Saturation Magnetization of Iron Nitride Thin Films on MgO Substrate," Spin, vol. 2, No. 1, Mar. 2012, 4 pp.

"Nanocrystalline soft magnetic material, FINEMET," Materials Magic, Hiatchi Metals, Apr. 2005, 12 pp.

Gutfleisch et al., "Magnetic Materials and Devices for the 21st Century: Stronger, Lighter, and More Energy Efficient," Advanced Materials, vol. 23, 2011, Dec. 15, 2010, pp. 821-842.

Ferguson et al., "The Tempering of Fe—C—N Martensite" Scripta Metallurgica, vol. 18, No. 11, Nov. 1984, pp. 1189-1194.

Brown et al., "The Crystal Structure and Phase Transitions of the Magnetic Shape Memory Compound Ni2MnGa," Journal of Physics: Condensed Matter, vol. 14, No. 43, Oct. 18, 2002, pp. 10159-10171.

Bruno, "Tight-Binding Approach to the Orbital Magnetic Moment and Magnetocrystalline Anisotropy of Transition-Metal Monolayers," Physical Review B, vol. 39, No. 1, Jan. 1, 1989, pp. 865-868.

Blöchl, "Projector Augmented-Wave Method," Physical Review B, vol. 50, No. 24, Dec. 15, 1994, pp. 17953-17979.

Entel et al., "Ab Initio Modeling of Martensitic Transformation (MT) in Magnetic Shape Memory Alloys," Journal of Magnetism and Magnetic Materials, vol. 310, Nov. 27, 2006, pp. 2761-2763.

Hodenberg et al., "Inhomogeneous Electron Gas," Physical Review, vol. 136, No. 3B, Nov. 9, 1964, pp. 864-871.

Sit et al., "Realistic Quantitative Descriptions of Electron Transfer Reactions: Diabatic Free-Energy Surfaces from First-Principles Molecular Dynamics," Physical Review Letters, vol. 97, Jul. 11, 2006, 4 pp.

Paseka et al., "Structure and Magnetic Properties of Ball-Milled Iron Nitride Powders," Journal of Alloys and Compounds, vol. 274, Mar. 10, 1998, pp. 248-253.

Giannozzi et al., "Quantum Espresso: A Modular and Open-Source Software Project for Quantum Simulations of Materials," Journal of Physics: Condensed Matter, vol. 21, Sep. 1, 2009, pp. 1-19.

Tong et al., "Low Temperature Wafer Direct Bonding," Journal of Microelectromechanical Systems, vol. 3, No. 1, Mar. 1994, pp. 29-35.

Fan et al., "Ferromagnetism at the Interfaces of Antiferromagnetic FeRh Epilayers," Physical Review B, vol. 82, Nov. 12, 2010, 5 pp.

Yao et al., "Formation and Magnetic Properties of Fe16N2 Films Prepared by Ion-Beam-Assisted Deposition," Journal of Magnetism and Magnetic Materials, vol. 177-181, Jan. 1998, pp. 1291-1292.

Skomski et al., "Giant Energy Product in Nanostructured Two-Phase Magnets," Physical Review B, vol. 48, No. 21, Dec. 1, 1993, pp. 15812-15816.

Tickle et al., "Magnetic and Magnetomechanical Properties of Ni2MnGa," Journal of Magnetism and Magnetic Materials, vol. 195, No. 3, Jun. 11, 1999, pp. 627-638.

Sabiryanov et al., "Electronic Structure and Magnetic Properties of Hard/Soft Multilayers," Journal of Magnetism and Magnetic Materials, vol. 177-181, Pt. 2, Jan. 1998, pp. 989-990.

Metzger et al., "Magnetism of α—Fe16N2 (Invited)," Journal of Applied Physics, vol. 76, No. 10, Nov. 15, 1994, pp. 6626-6631.

Kardonina et al., "Transformations in the Fe—N System," Metal Science and Heat Treatment, vol. 52, Nos. 9-10, Oct. 2010, pp. 5-15.

Chu et al., "Opportunities and Challenges for a Sustainable Energy Future," Nature, vol. 488, No. 7411, Aug. 16, 2012, pp. 294-303.

Blundell et al., "Polarized Neutron Reflection as a Probe of Magnetic Films and Multilayers," Physical Review B, vol. 46, No. 6, Aug. 1, 1992, pp. 3391-3400.

Zhang et al., "Energy Barriers and Hysteresis in Martensitic Phase Transformations," Acta Materialia, vol. 57, Jul. 17, 2009, pp. 4332-4352.

Kikkawa et al., "Particle Size Dependence in Low Temperature Nitridation Reaction for Fe16N2," Journal of Alloys and Compounds, vol. 449, Dec. 21, 2006 (online), pp. 7-10.

Okamoto et al., "Crystal Distortion and the Magnetic Moment of Epitaxially Grown α—Fe16N2," Journal of Magnetism and Magnetic Materials, vol. 208, Jul. 12, 1999, pp. 102-114.

Roy et al., "Depth Profile of Uncompensated Spins in an Exchange Bias System," Physical Review Letters, vol. 95, Jul. 21, 2005, 4 pp.

Uchida et al., "Magnetocrystalline Anisotropy Energies of Fe16N2 and Fe16C2," Journal of Magnetism and Magnetic Materials, vol. 310, Nov. 15, 2006, pp. 1796-1798.

Wang et al., "Properties of a New Soft Magnetic Material," Nature, vol. 407, Sep. 14, 2000, pp. 150-151.

Dudarev et al., "Electron-Energy-Loss Spectra and the Structural Stability of Nickel Oxide: An LSDA+U Study," Physical Review B, vol. 57, No. 3, Jan. 15, 1998, pp. 1505-1509.

Kart et al., "DFT Studies on Structure, Mechanics and Phase Behavior of Magnetic Shape Memory Alloys: Ni2MnGa," Physica Status Solidi, vol. 205, No. 5, Mar. 20, 1998, pp. 1026-1035.

Barman et al., "Structural and Electronic Properties of Ni2MnGa," Physical Review B, vol. 72, Nov. 8, 2005, 7 pp.

Atiq et al., "Preparation and the Influence of Co, Pt and Cr Additions on the Saturation Magnetization of α—Fe16N2 Thin Films," Journal of Alloys and Compounds, vol. 479, Feb. 23, 2009, pp. 755-758.

Okamoto et al., "Characterization of Epitaxially Grown Fe—N Films by Sputter Beam Method," Journal of Applied Physics, vol. 79, No. 3, Feb. 1, 1996, pp. 1678-1683.

Sugita et al., "Magnetic and Mossbauer Studies of Single-Crystal Fe16N2 and Fe—N Martensite Films Epitaxially Grown by Molecular Beam Epitaxy (Invited)," Journal of Applied Physics, vol. 76, No. 10, Nov. 15, 1994, pp. 6637-6641.

(56) References Cited

OTHER PUBLICATIONS

Sugita et al., "Giant Magnetic Moment and Other Magnetic Properties of Epitaxially Grown Fe16N2 Single-Crystal Films (Invited)," Journal of Applied Physics, vol. 70, No. 10, Nov. 15, 1991, pp. 5977-5982.

Toops et al., "Pre-Oxidized and Nitrided Stainless Steel Alloy Foil for Proton Exchange Membrane Fuel Cell Bipolar Plates. Part 2: Single-Cell Fuel Evaluation of Stamped Plates," Journal of Power Sources, vol. 195, Mar. 19, 2010, pp. 5619-5627.

Klemmer et al., "Magnetic Hardening and Coercivity Mechanisms in L1 Ordered FePd Ferromagnets," Scripta Metallurgica et Materialia, vol. 33, Nos. 10-11, Dec. 1, 1995, pp. 1793-1805.

Ohtani et al., "Magnetic Properties of Mn—Al—C Permanent Magnet Alloys," IEEE Transactions on Magnetics, vol. MAG-13, No. 5, Sep. 1977, pp. 1328-1330.

Osaka et al., "A Soft Magnetic CoNiFe Film With High Saturation Magnetic Flux Density and Low Coercivity," Nature, vol. 392, Apr. 23, 1998, pp. 796-798.

Schrefl et al., "Exchange Hardening in Nano-Structured Two-Phase Permanent Magnets," Journal of Magnetism and Magnetic Materials, vol. 127, Jul. 12, 1993, pp. 273-277.

Kakeshita et al., "Effect of Magnetic Fields on Athermal and Isothermal Martensitic Transformations in Fe—Ni—Mn Alloys," Materials Transactions, vol. 34, No. 5, Dec. 9, 1992, pp. 415-422.

Koyano et al., "Magnetization of α' Iron Nitride Produced Through the fcc→bct Martensitic Transformation in High Magnetic Field," Journal of Applied Physics, vol. 100, No. 3, Aug. 1, 2006, 5 pp.

Oku et al., "Small-Angle Polarized Neutron Scattering Study of Spherical Fe16N2 Nano-Particles for Magnetic Recording Tape," Physica B, vol. 404, Sep. 1, 2009, pp. 2575-2577.

Shimoda et al., "High-Energy Cast Pr—Fe—B Magnets," Journal of Applied Physics, vol. 64, No. 10, Nov. 15, 1988, pp. 5290-5292.

Weber et al., "Search for Giant Magnetic Moments in Ion-Beam-Synthesized α—Fe16N2," Thin Solid Films, vol. 279, Nos. 1-2, Jun. 1996, pp. 216-220.

Watanabe et al., "A New Challenge: Grain Boundary Engineering for Advanced Materials by Magnetic Field Application," Journal of Materials Science, vol. 41, No. 23, Oct. 24, 2006 (online), pp. 7747-7759.

Takahashi et al., "Preparation of FeN Thin Films by Chemical Vapor Deposition Using a Chloride Source," Materials Letters, vol. 42, No. 6, Mar. 2000, pp. 380-382.

Stern et al., "Electronic and Structural Properties of Fe3Pd—Pt Ferromagnetic Shape Memory Alloys," Journal of Applied Physics, vol. 91, No. 10, May 15, 2002, pp. 7818-7820.

Qian et al., "NiZn Ferrite Thin Films Prepared by Facing Target Sputtering," IEEE Transactions Magnetics, vol. 33, No. 5, Sep. 1997, pp. 3748-3750.

Takahashi et al., "New Soft Magnetic Material of α'—Fe—C With High Bs," Journal of Magnetism and Magnetic Materials, vol. 239, Nos. 1-3, Feb. 1, 2002, pp. 479-483.

Inoue et al., "Enhancement of the Formation of Fe16N2 on Fe Films by Co Additions (Invited)," Journal of Applied Physics, vol. 76, No. 10, Nov. 15, 1994, pp. 6653-6655.

Tsuchiya et al., "Spin Transition in Magnesiowüstite in Earth's Lower Mantle," Physical Review Letters, vol. 94, May 18, 2006, 4 pp.

Liu et al., "Nucleation Behavior of Bulk Ni—Cu Alloy and Pure Sb in High Magnetic Fields," Journal of Crystal Growth, vol. 321, Mar. 2, 2011, pp. 167-170.

Liu et al., "Effects of High Magnetic Fields on Solidification Microstructure of Al—Si Alloys," Journal of Material Science, vol. 46, Oct. 22, 2010, pp. 1628-1634.

Okunev et al., "The Low-Temperature Electric Conductivity of YBaCuO and LaSrMnO Dielectric Films Obtained by a Pulsed Laser Sputter Deposition Technique," Technical Physics Letters, vol. 26, No. 10, May 6, 2000, pp. 903-906.

Anisimov et al., "Density-Functional Calculation of Effective Coulomb Interactions in Metals," Physical Review B, vol. 43, No. 10, Apr. 1, 1991, pp. 7570-7574.

Anisimov et al., "Band-Structure Description of Mott Insulators (NiO, MnO, FeO, CoO)," Journal of Physics: Condensed Matter, vol. 2, No. 17, Apr. 30, 1990, pp. 3973-3987.

Anisimov et al., "First-Principles Calculations of the Electronic Structure and Spectra of Strongly Correlated Systems: the LDA+U Method," Journal of Physics: Condensed Matter, vol. 9, No. 4, Jan. 27, 1997, pp. 767-808.

Anisimov et al., "Band Theory and Mott Insulators: Hubbard U Instead of Stoner I," Physical Review B, vol. 44, No. 3, Jul. 15, 1991, pp. 943-954.

Campo et al., "Extended DFT + U + V Method With On-Site and Inter-Site Electronic Interactions," Journal of Physics: Condensed Matter, vol. 22, Jan. 19, 2010 (online), 12 pp.

Nimura et al., "Facing Targets Sputtering System for Depositing Co—Cr Perpendicular Magnetic Recording Media," Journal of Vacuum Science Technology, vol. 5, No. 1, Jan. 1987, pp. 109-110.

Lauter et al., "Highlights from the Magnetism Reflectometer at the SNS," Physica B, vol. 404, Sep. 1, 2009, pp. 2543-2546.

Godlevsky et al., "Soft Tetragonal Distortions in Ferromagnetic Ni2MnGa and Related Materials from First Principles," Physical Review B, vol. 63, Mar. 2, 2001, 5 pp.

Hou et al., "SmCo5/Fe Nanocomposites Synthesized from Reductive Annealing of Oxide Nanoparticles," Applied Physics Letters, vol. 91, Oct. 12, 2007, 3 pp.

Zhang et al., "Shift of the Eutectoid Point in the Fe—C Binary System by a High Magnetic Field," Journal of Physics D: Applied Physics, vol. 40, Oct. 19, 2007, pp. 6501-6506.

Pickett et al., "Reformulation of the LDA + U Method for a Local-Orbital Basis," Physical Review B, vol. 58, No. 3, Jul. 15, 1998, pp. 1201-1209.

Kohn et al., "Self-Consistent Equations Including Exchange and Correlation Effects," Physical Review, vol. 140, No. 4A, Nov. 15, 1965, pp. 1133-1138.

Gong et al., "Mechanically Alloyed Nanocomposite Magnets," Journal of Applied Physics, vol. 75, No. 10, May 15, 1994, pp. 6649-6651.

Li et al., "Effect of Assistant rf Field on Phase Composition of Iron Nitride Film Prepared by Magnetron Sputtering Process," Journal of Vacuum Science & Technology A, vol. 24, No. 1, Dec. 23, 2005 (online), pp. 170-173.

Liu et al., "Nanocrystalline Soft Magnetic Ribbon with α—Fe16N2 Nanocrystallites Embedded in Amorphous Matrix," Journal of Magnetism and Magnetic Materials, vol. 320, Jun. 10, 2008, pp. 2752-2754.

Wallace et al., "Enhanced Fe Moment in Nitrogen Martensite and Fe16N2 (Invited)," Journal of Applied Physics, vol. 76, No. 10, Nov. 15, 1994, pp. 6648-6652.

Wang et al., "Searching, Fabricating and Characterizing Magnetic Materials With Giant Saturation Magnetization," TMRC 2014, Aug. 11, 2014, 2 pp.

Wang et al., "Growth, Structural, and Magnetic Properties of Iron Nitride Thin Films Deposited by dc Magnetron Sputtering," Applied Surface Science, vol. 220, May 20, 2003, pp. 30-39.

Yamamoto et al., "Formation of Fe16N2 in Deformed Iron by Ion Implantation Method," Proceedings of 1998 International Conference on Ion Implantation Technology, Jun. 22-26, 1998, 4 pp.

Rui et al., "In-Cluster-Structured Exchange-Coupled Magnets with High Energy Densities," Applied Physics Letters, vol. 89, Sep. 19, 2006, 3 pp.

Bao et al., "Synthesis and Properties of α—Fe16N2 in Magnetic Particles," Journal of Applied Physics, vol. 75, No. 10, May 15, 1994, pp. 5870-5872.

Gao et al., "Exchange-coupling interaction and effective anisotropy in nanocomposite permanent materials," Chinese Science Bulletin, vol. 47, No. 14, Jul. 2002, 4 pp.

Grimsditch et al., "Exchange-spring systems: Coupling of hard and soft ferromagnets as measured by magnetization and Brillouin light scattering (Invited)," Journal of Applied Physics, vol. 85, No. 8, Apr. 15, 1999, 5 pp.

Stäblein, "Chapter 7: Hard Ferrites and Plastoferrites," Handbook of Ferromagnetic Materials, vol. 3, 1982, 162 pp. (Applicant points out, in accordance with MPEP 609.04(a), that the year of publica-

(56) References Cited

OTHER PUBLICATIONS tion, 1982, is sufficiently earlier than the effective U.S. filing date, Mar. 28, 2014, so that the particular month of publication is not in issue.).
Murata et al., "Physical Properties of Steel and Nitrogen," Japan, Agne Gijutsu Center Inc., Dec. 15, 2005, 8 pp.
International Search Report and Written Opinion of International Application No. PCT/US2015/022763, dated Jun. 29, 2015, 34 pp.
International Preliminary Report on Patentability from International Application No. PCT/US2015/022763, dated Jul. 18, 2016, 6 pp.
Notification Concerning Payment of the Preliminary Examination and Handling Fees from International Application No. PCT/US2015/022763, dated Feb. 16, 2016, 2 pp.
Office Action and Search Report, and translation thereof, from counterpart Taiwan Application No. 104110159, dated Nov. 3, 2015, 21 pp.
Reply to Notification Concerning Payment of the Preliminary Examination and Handling Fees dated Feb. 16, 2016, from International Application No. PCT/US2015/022763, filed Mar. 3, 2016, 2 pp.
Reply to Written Opinion dated Jun. 29, 2015, from International Application No. PCT/US2015/022763, filed Jan. 28, 2016, 20 pp.
U.S. Appl. No. 15/129,439, by Wang et al., filed Sep. 27, 2016.
U.S. Appl. No. 62/107,733, by Wang et al., filed Jan. 26, 2015.
U.S. Appl. No. 62/107,748, by Wang et al., filed Jan. 26, 2015.
U.S. Appl. No. 62/035,245, by Wang et al., filed Aug. 8, 2014.
U.S. Appl. No. 62/035,230, by Wang et al., filed Aug. 8, 2014.
U.S. Appl. No. 62/107,700, by Wang et al., filed Jan. 26, 2015.
U.S. Appl. No. 62/840,221, by Wang et al., filed Jun. 27, 2013.
U.S. Appl. No. 61/840,248 by Wang et al., filed Jun. 27, 2013.
Huang et al., "Synthesis and characterization of Fe16N2 in bulk form," Journal of Applied Physics, vol. 75, No. 10, May 15, 1994, 3 pp.
Tsubakino et al., "Formation of Fe16N2 in iron sheet by an ion implantation method," Materials Chemistry and Physics 54, Elsevier, Jul. 1998, pp. 301-304.
Tsubakino et al., "High resolution transmission electron microscopic study of the formation of Fe16N2 in bulk iron by ion implantation," Material Letters 26, Elsevier, Feb. 1996, pp. 155-159.
Notice of acceptance from patent application from counterpart Australian Application No. 2015235987, dated Mar. 6, 2017, 3 pp.

\* cited by examiner

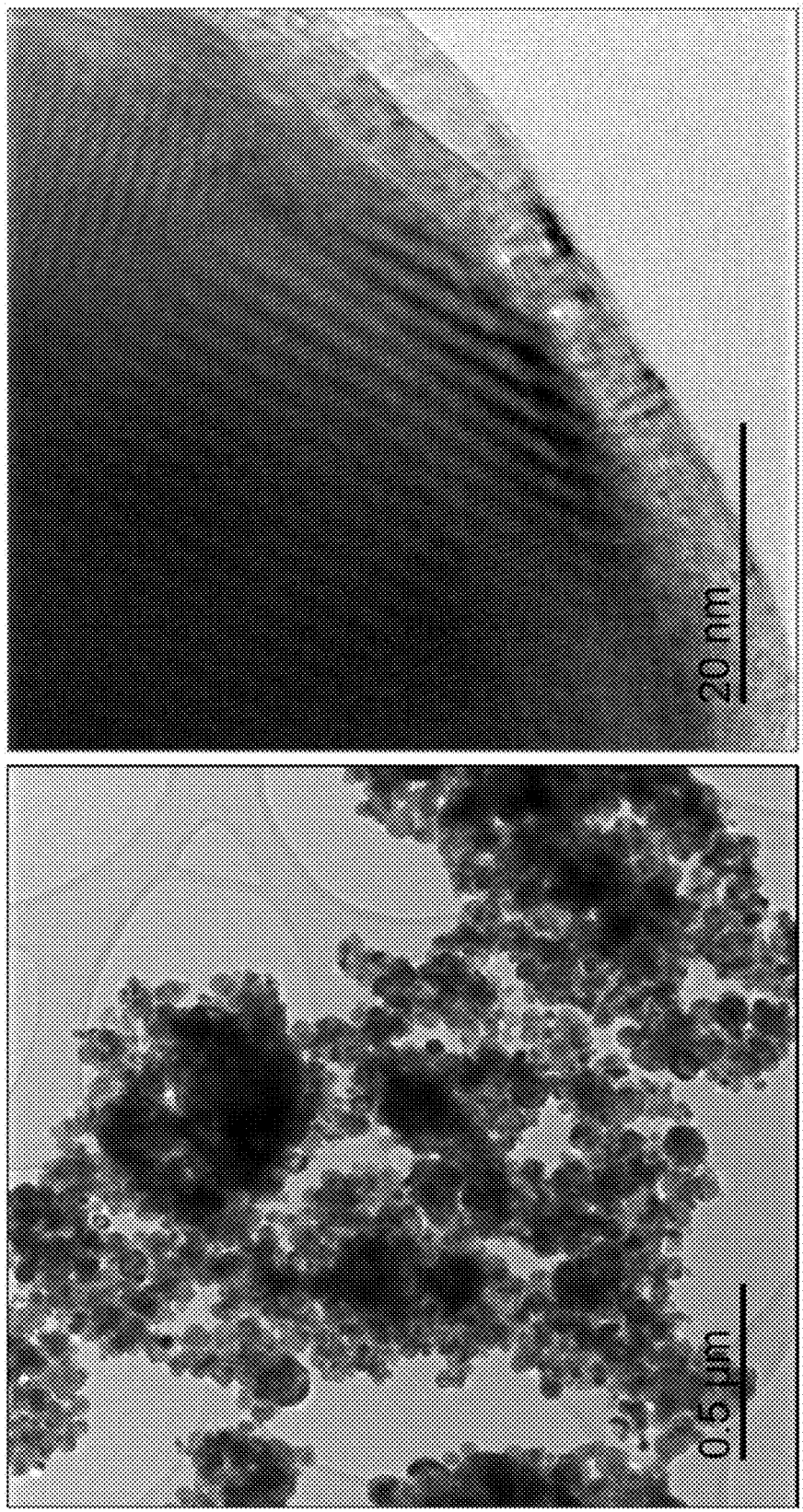

IRON NITRIDE MAGNETIC MATERIAL INCLUDING COATED NANOPARTICLES

This application is a national stage entry under 35 U.S.C. § 371 of International Application No. PCT/US2015/022763, filed Mar. 26, 2015, which claims the benefit of U.S. Provisional Patent Application No. 61/971,730, entitled, "IRON NITRIDE MAGNETIC MATERIAL INCLUDING COATED NANOPARTICLES," and filed Mar. 28, 2014. The entire contents of International Application No. PCT/US2015/022763 and U.S. Provisional Patent Application Nos. 61/971,730 are incorporated herein by reference for all purposes.

TECHNICAL FIELD

The disclosure relates to iron nitride magnetic materials.

BACKGROUND

Iron nitride magnets based on the $Fe_{16}N_2/Fe_8N$ phase are of great interest as a magnetic material for applications ranging from data storage to electrical motors for vehicles, wind turbines, and other power generation equipment. The component base elements (Fe, N) are inexpensive and widely available, in contrast to rare earth elements in rare earth element-based magnets, which are costly and subject to supply availability risks. The $Fe_{16}N_2$ phase, which is the ordered version of $Fe_8N$, has a large magnetic anisotropy constant and saturation magnetization but is exceedingly difficult to manufacture.

SUMMARY

The disclosure describes techniques for forming nanoparticles including $Fe_{16}N_2$ iron nitride phase. In some examples, the nanoparticles may be formed by first forming nanoparticles including iron, nitrogen, and at least one of carbon or boron. The carbon or boron may be incorporated into the nanoparticles such that the iron, nitrogen, and at least one of carbon or boron are mixed. Alternatively, the at least one of carbon or boron may be coated on a surface of a nanoparticle including iron and nitrogen. The nanoparticle including iron, nitrogen, and at least one of carbon or boron then may be annealed to form at least one phase domain including at least one of $Fe_{16}N_2$, $Fe_{16}(NB)_2$, $Fe_{16}(NC)_2$, or $Fe_{16}(NCB)_2$. In some examples, the nanoparticles may include at least one $Fe_{16}N_2$ phase domain, and additionally may include at least one phase domain of at least one of $Fe_{16}(NB)_2$, $Fe_{16}(NC)_2$, or $Fe_{16}(NCB)_2$.

In some examples, the nanoparticles including $Fe_{16}N_2$ iron nitride phase may be formed by forming a nanoparticle including iron and nitrogen, coating the nanoparticle including iron and nitrogen with carbon, boron, or both, and annealing the coated nanoparticle to include at least one $Fe_{16}N_2$ phase domain. In other examples, the nanoparticles including $Fe_{16}N_2$ iron nitride phase may be formed by forming an iron nanoparticle coating the iron nanoparticle with carbon, boron, or both. The coated iron nanoparticle then may be nitridized and annealed to form at least one $Fe_{16}N_2$ phase domain. In some examples, the nanoparticles may include at least one $Fe_{16}N_2$ phase domain, and additionally may include at least one phase domain of at least one of $Fe_{16}(NB)_2$, $Fe_{16}(NC)_2$, or $Fe_{16}(NCB)_2$.

In one example, the disclosure describes a method including forming a nanoparticle including iron and nitrogen, coating a surface of the nanoparticle with at least one of carbon or boron to form a coated nanoparticle, and annealing the coated nanoparticle to form at least one $Fe_{16}N_2$ phase domain.

In another example, the disclosure describes a nanoparticle formed by any of the techniques described herein.

In an additional example, the disclosure describes a system configured to perform any of the techniques described herein.

In a further example, the disclosure describes a nanoparticle including a core comprising iron and nitrogen, and a coating comprising at least one of carbon or boron formed on the nanoparticle.

In another example, the disclosure describes a system including a source chamber, a deposition chamber, a loadlock chamber, a first sputtering gun at least partially disposed in the source chamber, a second sputtering gun at least partially disposed in the loadlock chamber, and a substrate transfer mechanism operable to move a substrate between the deposition chamber and the loadlock chamber.

In a further example, the disclosure describes a method including forming a coating comprising at least one of carbon or boron on a surface of a nanoparticle comprising iron to form a coated iron nanoparticle, and nitriding the coated iron nanoparticle by exposing the coated iron nanoparticle to atomic nitrogen to form a nitride nanoparticle, wherein the nitride nanoparticle comprises at least one $Fe_{16}N_2$ phase domain.

In another example, the disclosure describes a method comprising forming a nanoparticle including iron, nitrogen, and between about 0.5 at. % and about 11 at. % of at least one of carbon or boron; and annealing the nanoparticle to form at least one phase domain comprising at least one of $Fe_{16}N_2$, $Fe_{16}(NB)_2$, $Fe_{16}(NC)_2$, or $Fe_{16}(NCB)_2$.

The details of one or more examples are set forth in the accompanying drawings and the description below. Other features, objects, and advantages will be apparent from the description and drawings, and from the claims.

BRIEF DESCRIPTION OF DRAWINGS

FIGS. 10A and 10B are micrographs illustrating a plurality of nanoparticles including $Fe_{16}N_2$ phase and a magnified view of a single nanoparticles including $Fe_{16}N_2$ phase, respectively.

DETAILED DESCRIPTION

Figure 1:
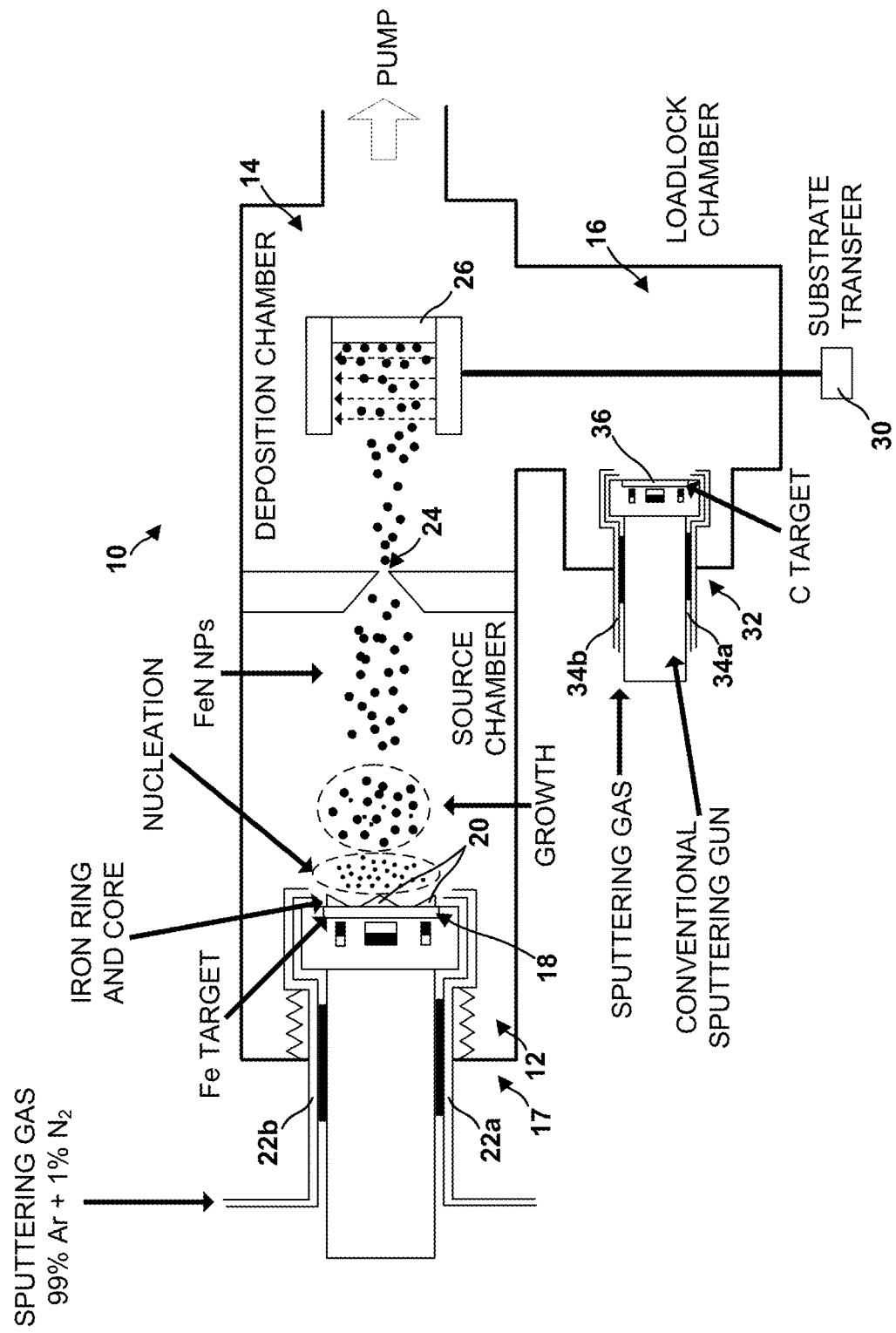
FIG. 1 is a conceptual and schematic diagram illustrating an example system 10 for forming iron nitride nanoparticles that include a coating including carbon, boron, or both.

The disclosure describes techniques for forming nanoparticles including $Fe_{16}N_2$ iron nitride phase, and for forming iron nitride permanent magnets comprising nanoparticles. In some examples, the nanoparticles may be formed by first forming nanoparticles including iron, nitrogen, and at least one of carbon or boron. In some examples, the nanoparticles may include between about 0.5 at. % and about 11 at. % of at least one of carbon or boron. The carbon or boron may be incorporated into the nanoparticles such that the iron, nitrogen, and at least one of carbon or boron are mixed, forming, for example, at least one of an iron metal phase, an iron carbide phase, an iron boride phase, or an iron carbo-boride phase. Alternatively or additionally, the at least one of carbon or boron may be coated on a surface of a nanoparticle including iron and nitrogen. The nanoparticle including iron, nitrogen, and at least one of carbon or boron then may be annealed to form at least one phase domain including at least one of $Fe_{16}N_2$, $Fe_{16}(NB)_2$, $Fe_{16}(NC)_2$, or $Fe_{16}(NCB)_2$. In some examples, the nanoparticles may include at least one $Fe_{16}N_2$ phase domain, and additionally may include at least one phase domain of at least one of $Fe_{16}(NB)_2$, $Fe_{16}(NC)_2$, or $Fe_{16}(NCB)_2$.

In some examples, the nanoparticles including $Fe_{16}N_2$ iron nitride phase may be formed by forming a nanoparticle including iron, nitrogen, and, optionally, at least one of carbon or boron, coating the nanoparticle with carbon, boron, or both, and annealing the coated nanoparticle to form at least one $Fe_{16}N_2$ phase domain. In other examples, the nanoparticles including $Fe_{16}N_2$ iron nitride phase may be formed by forming a nanoparticle including at least one of iron, iron carbide, iron boride, or iron carbo-boride, and, optionally, coating the nanoparticle with carbon, boron, or both. The coated or uncoated nanoparticle that includes at least one of iron, iron carbide, iron boride, or iron carbo-boride then may be nitridized and annealed to form at least one $Fe_{16}N_2$ phase domain. In some examples, the annealed nanoparticles may include at least one $Fe_{16}N_2$ phase domain, and additionally may include at least one phase domain of at least one of $Fe_{16}(NB)_2$, $Fe_{16}(NC)_2$, or $Fe_{16}(NCB)_2$.

In some examples, the disclosure describes iron nitride nanoparticles incorporating carbon, boron, or both and techniques for forming iron nitride nanoparticles incorporating carbon, boron, or both. In some examples, the incorporation of carbon, boron, or both in iron nitride nanoparticles may improve magnetic properties of the iron nitride nanoparticles compared to iron nitride nanoparticles that do not incorporate carbon or boron. In some examples, the iron nitride nanoparticles incorporating carbon, boron, or both may be formed by sputtering or another vapor deposition technique. In some examples, iron nitride nanoparticle may be formed, followed by forming a coating of carbon, boron, or both on surfaces of the iron nitride nanoparticles. The coated iron nitride nanoparticles then may be annealed to form at least one $Fe_{16}N_2$ phase domain. In some examples, the carbon, boron, or both from the coating may diffuse into the iron nitride nanoparticles and be incorporated into the at least one $Fe_{16}N_2$ phase domain. Incorporation of the carbon, boron, or both into the at least one $Fe_{16}N_2$ phase domain may result in formation of at least one phase domain of $Fe_{16}(NC)_2$, $Fe_{16}(NB)_2$, or $Fe_{16}(NCB)_2$, respectively.

In some examples, the disclosure describes techniques for forming iron nitride magnetic materials incorporating carbon, boron, or both through the use of carbon or boron coated Fe nanoparticles. In some examples, the carbon or boron coated Fe nanoparticles may be used as a precursor for synthesis of $Fe_{16}N_2$ phase nanopowder rather than oxide coated or hydroxide coated precursor powders. The carbon or boron coated Fe nanoparticles may improve $Fe_{16}N_2$ phase yield, magnetic properties, or both in the $Fe_{16}N_2$ phase nanopowder compared to oxide coated or hydroxide coated precursor powders.

In some examples, the carbon or boron coated $Fe_{16}N_2$ precursors may include other dopants, including those with ternary and higher order additions to further enhance synthesis yield and magnetic properties, including metals (e.g. Co, Mn, Ni, Co, Cr, Ti, La, other transition metals, and rare earths), as well as oxide coatings such as alumina or silica.

The techniques described herein may be used to form bulk iron nitride permanent magnets. For example, the techniques described herein for forming material comprising nanoparticles having $Fe_{16}N_2$ iron nitride may be used in processes to form iron nitride bulk permanent magnets described in International Patent Application Number PCT/US2012/051382, filed on Aug. 17, 2012, and titled "IRON NITRIDE PERMANENT MAGNET AND TECHNIQUE FOR FORMING IRON NITRIDE PERMANENT MAGNET;" and International Patent Application Number PCT/US2014/015104, filed on Feb. 6, 2014, and titled "IRON NITRIDE PERMANENT MAGNET AND TECHNIQUE FOR FORMING IRON NITRIDE PERMANENT MAGNET;" and U.S. Provisional Patent Application No. 61/935,516, filed Feb. 4, 2014, and titled "IRON NITRIDE MATERIALS AND MAGNETS INCLUDING IRON NITRIDE MATERIALS," the entire contents of which are incorporated herein by reference.

FIG. 1 is a conceptual and schematic diagram illustrating an example system 10 for forming iron nitride nanoparticles that include a coating including carbon, boron, or both. As shown in FIG. 1, system 10 includes a source chamber 12, a deposition chamber 14, and a loadlock chamber 16. Disposed partially within source chamber 12 is a first sputtering gun 17 including sputtering gas inlets 22a and 22b, and an iron target 18 including an iron ring and core 20. In some examples, the iron target 18 including the iron ring and core 20 may include substantially pure iron (e.g., iron with a purity of about 99.99 atomic percent (at. %)).

Source chamber 12 is fluidically coupled to a gas source (not shown in FIG. 1) via sputtering gas inlets 22a and 22b. In some examples, the sputtering gas may include a source of a mixture of argon (Ar) and nitrogen ($N_2$). For example, the sputtering gas may include a mixture of about 99 atomic percent (at. %) Ar and about 1 at. % $N_2$. The sputtering gas mixture is excited to high energy, which results in splitting of the $N_2$ into nitrogen ions. Additionally, the high energy argon atoms impinge upon the iron target 18, which results in iron atoms being ejected from the target 18. This process forms a vapor cloud including active iron and nitrogen atoms in proximity of iron target 18.

In some examples, the sputtering power density used during formation of the iron nitride nanoparticles may be between about 1 watt per centimeter squared (W/cm$^2$) and about 100 W/cm$^2$. In some examples, the sputtering pressure during formation of the iron nitride nanoparticles may be between about 10 mTorr (about 1.33 Pascals) and about 2000 mTorr (about 266.66 Pascals), such as between about 200 mTorr (about 26.66 Pascals) and about 500 mTorr (about 66.66 Pascals). In some examples, the base pressure of system 10 may be less than about $1 \times 10^{-7}$ Torr.

The vapor cloud including active iron and nitrogen atoms begins to nucleate to form iron nitride nanoparticles, which continue to grow in size as the nanoparticles and vapor cloud are carried through the source chamber by gas flow of the sputtering gas under influence of a pump. The iron nitride nanoparticles travel through the aperture 24 between source chamber 12 and deposition chamber 14 and are directed at substrate 26, where the iron nitride nanoparticles are deposited. In some examples, the iron nitride nanoparticles define a characteristic dimension, such as a diameter, between about 0.5 nm and about 200 nm, such as between about 0.5 nm and about 50 nm, or between about 5 nm and about 200 nm, or between about 5 nm and about 50 nm. In some examples, a plurality of nanoparticles may include a distribution of characteristic dimensions, the nominal value for the characteristic dimension for the plurality of nanoparticles may be the mean characteristic dimension, the median characteristic dimension, or the like.

Substrate 26 may be coupled to a substrate transfer mechanism 30, which is operable to move substrate 26 between deposition chamber 14 and loadlock chamber 16. After formation of the iron nitride nanoparticles, substrate transfer mechanism 30 may transfer substrate 26 to loadlock chamber, adjacent to second sputtering gun 32. Second sputtering gun 32 is partially disposed in loadlock chamber 16. Second sputtering gun 32 includes sputtering gas inlets 34a and 34b, and a carbon target 36. Sputtering gas inlets 34a and 34b may be fluidically connected to a second sputtering gas source. The second sputtering gas source may include a source of argon gas in some examples.

The high energy argon atoms impinge upon the carbon target 36, which results in carbon atoms being ejected from the target 36. This process forms a vapor cloud including active carbon atoms in proximity of carbon target 36. The carbon atoms may be carried adjacent to the iron nitride nanoparticles deposited on substrate 26, and may at least partially coat surfaces of the iron nitride nanoparticles. In some examples, rather than a carbon target 36, the target may include boron or a mixture of carbon and boron.

In some examples, the sputtering power density used during formation of the iron nitride nanoparticles may be between about 1 W/cm² and about 100 W/cm². In some examples, the sputtering pressure during formation of the iron nitride nanoparticles may be between about 10 mTorr (1.33 Pascals) and about 2000 mTorr (about 266.66 Pascals, such as between about 200 mTorr (about 26.66 Pascals) and about 500 mTorr (about 66.66 Pascals).

The coating including carbon, boron, or both may be deposited to predetermined thickness. In some examples, the predetermined thickness may be between about 5 nanometers (nm) and about 50 nm. In some examples, a coating thickness of less than about 5 nm may have less of an effect on magnetic properties of the annealed iron nitride nanoparticles, or may have substantially no effect on magnetic properties of the annealed iron nitride nanoparticles.

After deposition of the carbon (or boron or both) coating on the iron nitride nanoparticles, the coated iron nitride nanoparticles may be annealed. In some examples, the coated iron nitride nanoparticles may be annealed under vacuum, such as at a pressure under about $5 \times 10^{-8}$ Torr (about $6.66 \times 10^{-6}$ Pa). In some examples, the annealing may performed at a temperature between about 150° C. and about 250° C., and may be for between about 20 hours and 48 hours. The annealing may form $Fe_{16}N_2$ phase iron nitride in the coated iron nitride nanoparticles. In some examples, at least some carbon, boron, or both, if present in the coating, may diffuse into the interior of the coated iron nitride nanoparticles during the annealing process.

In some examples, because both the sputtering techniques and the annealing technique are performed in atmospheres substantially free of oxidants, oxidation of the iron nitride nanoparticles may be reduced or substantially prevented. While not wishing to be bound by any theory, reducing or substantially preventing oxidation of the iron nitride particles may contribute to improved magnetic properties of the annealed iron nitride nanoparticles, such as coercivity, magnetization, and the like.

By coating the iron nitride nanoparticles with carbon, boron, or both prior to annealing, the volume fraction of $Fe_{16}N_2$ phase may be increased compared to an uncoated nanoparticle. By increasing the volume fraction of $Fe_{16}N_2$ phase, magnetic properties of the annealed iron nitride nanoparticles may be improved, such as coercivity, magnetization, and the like.

Iron nitride nanoparticles may be useful in a wide array of applications. For example, iron nitride nanoparticles may be consolidated to form a bulk material (e.g., a material with a minimum dimension of at least 0.1 mm). As other example, iron nitride nanoparticles may be used in medical and biological applications as particles in sensing applications. By improving magnetic properties of iron nitride nanoparticles, the iron nitride nanoparticles may be used in more applications or may facilitate more effective use in current applications.

The disclosure also describes techniques for utilizing iron nanoparticles including carbon, boron, or both to form iron nitride nanoparticles. In some example, the iron nanoparticles may be coated with carbon, boron, or both. In some examples, carbon, boron, or both may mixed with iron in the iron nanoparticles, which may result in at least one of an iron metal, an iron carbide, an iron boride, or an iron carboboride phase, with or without one or more oxide phases on a surface of the iron nanoparticles. In some examples, the nanoparticles may include both a core including iron mixed with carbon, boron, or both, and a coating including carbon, boron, or both.

In some examples, in addition to iron and boron, carbon, or both, the iron nanoparticles may include oxygen. For example, at least some iron in the iron nitride nanoparticles may be oxidized.

In some examples, the iron nanoparticles may include other dopants as an alternative to or in addition to oxygen. For example, the iron nanoparticles may include at least one metal dopant, such as Co, Mn, Cr, Ni, Ti, La, other transition metals, and/or a rare earth element. As another example, the iron nanoparticles may include at least one oxide dopant, such as alumina or silica, which may be mixed with the iron or may be a coating on the iron nanoparticles. The iron nanoparticles may define a range of sizes, such as a mean or median diameter between about 20 nm and about 40 nm.

In some examples, such as when the iron nanoparticles include an oxide, the iron nanoparticles may be exposed to a reducing species to reduce the oxide. For example, the iron nanoparticles may be exposed to a reducing gas, such as $H_2$, at a temperature between about 200° C. and about 500° C. for up to about 10 hours to reduce oxides present on or in the iron nanoparticles. In some examples, the iron nanoparticles may not include oxides (e.g., due to the present of a coating including carbon, boron, or both on surfaces of the iron nanoparticles). In some of these examples, the iron nanoparticles may not be exposed to the reducing step. In some examples, eliminating the reducing step may reduce powder sintering, which may contribute to enhanced magnetic properties.

The iron nanoparticles including at least one of carbon or boron may be nitridized by exposure to a nitrogen source. In some examples, the nitrogen source may include ammonia ($NH_3$), such as substantially pure gaseous ammonia or a gaseous mixture of ammonia, nitrogen, and hydrogen. In other examples, urea may be used as a nitrogen source.

In some examples, the iron nanoparticles may be nitridized by exposure to a nitrogen source at a temperature between about 100° C. and about 200° C. for up to about 1 week.

After nitridization, the iron nanoparticles may include a mixture of iron, nitrogen, at least one of carbon or boron, and any other dopants present in the iron nanoparticles. At least some of the iron and nitrogen may form an $Fe_{16}N_2$ phase. Other phases also may be present in the iron nanoparticles after nitridization, such as Fe phase, iron oxides, other iron nitrides (such as $Fe_8N$, $Fe_4N$, $Fe_3N$, or the like), iron carbides or borides, as well as B, C, and/or doped $Fe_{16}N_2$ phase.

Optionally, the nitridized nanoparticles may be annealed. In some examples, the nitridized nanoparticles may be annealed under vacuum, such as at a pressure under about $5\times10^{-8}$ Torr (about $6.66\times10^{-6}$ Pa). In some examples, the annealing may performed at a temperature between about 150° C. and about 250° C., and may be for between about 20 hours and 48 hours. The annealing may form $Fe_{16}N_2$ phase iron nitride in the coated iron nitride nanoparticles. In some examples, the annealing may form at least one phase domain including at least one of $Fe_{16}(NB)_2$, $Fe_{16}(NC)_2$, or $Fe_{16}(NCB)_2$ in addition to the $Fe_{16}N_2$ phase iron nitride. In some examples, at least some carbon, boron, or both, if present in the coating, may diffuse into the interior of the coated iron nitride nanoparticles during the annealing process.

In some examples, use of iron nanoparticles including at least one of carbon or boron may increase a percentage of the nanoparticle that includes $Fe_{16}N_2$ phase after nidridization compared to using other precursor materials, such as iron oxide nanoparticles. The increase in $Fe_{16}N_2$ phase may contribute to improved magnetic properties, such as coercivity, magnetization, and the like.

Clause 1: In some examples, the disclosure describes a method comprising: forming a nanoparticle including iron and nitrogen; coating a surface of the nanoparticle with at least one of carbon or boron to form a coated nanoparticle; and annealing the coated nanoparticle to form at least one $Fe_{16}N_2$ phase domain.

Clause 2: The method of clause 1, wherein forming the nanoparticle comprises: directing an energized sputtering gas at a target comprising iron to form an iron vapor; forming atomic nitrogen vapor; and condensing iron atoms from the iron vapor and nitrogen atoms from the atomic nitrogen vapor to form the nanoparticle including iron and nitrogen.

Clause 3: The method of clause 1, wherein the sputtering gas comprises argon and diatomic nitrogen, and wherein the atomic nitrogen vapor is formed from the diatomic nitrogen.

Clause 4: The method of any one of clauses 1 to 3, wherein a sputtering power density used while forming the nanoparticle is between about 1 $W/cm^2$ and about 100 $W/cm^2$, and wherein a sputtering pressure used while forming the nanoparticle is between about 26.66 Pascals and about 66.66 Pascals.

Clause 5: The method of any one of clauses 1 to 4, wherein the nanoparticle comprises a plurality of nanoparticles.

Clause 6: The method of any one of clauses 1 to 5, wherein coating the surface of the nanoparticle comprises: directing an energized sputtering gas at a target comprising the at least one of carbon or boron to form a vapor comprising atoms of the at least one of carbon or boron; and condensing the atoms of the at least one of carbon or boron from the vapor to form the coated nanoparticle.

Clause 7: The method of clause 6, wherein the at least one of carbon or boron comprises carbon.

Clause 8: The method of clause 6 or 7, wherein the sputtering gas comprises argon.

Clause 9: The method of any of clauses 1 to 8, wherein a sputtering power density used while coating the surface of the nanoparticle is between about 1 $W/cm^2$ and about 100 $W/cm^2$, and wherein a sputtering pressure used while coating the surface of the nanoparticle is between about 26.66 Pascals and about 66.66 Pascals.

Clause 10: The method of any of clauses 1 to 9, wherein the coated nanoparticle comprises a coating including the at least one of carbon or boron, and wherein a thickness of the coating is between about 0.5 nanometers and about 50 nanometers.

Clause 11: The method of any of clauses 1 to 10, wherein annealing the coated nanoparticle to form the at least one $Fe_{16}N_2$ phase domain comprises annealing the coated nanoparticle to form the at least one $Fe_{16}N_2$ phase domain at a temperature between about 150° C. and about 250° C. for between about 20 hours and 48 hours.

Clause 12: A nanoparticle formed by the method of any of clauses 1 to 11.

Clause 13: A system configured to perform the method of any of clauses 1 to 11.

Clause 14: In some examples, the disclosure describes a nanoparticle comprising: a core comprising iron and nitrogen; and a coating comprising at least one of carbon or boron formed on the nanoparticle.

Clause 15: The nanoparticle of clause 14, wherein the nanoparticle comprises at least one $Fe_{16}N_2$ phase domain.

Clause 16: The nanoparticle of clause 14 or 15, wherein the at least one of carbon or boron comprises carbon.

Clause 17: The nanoparticle of any of clause 14 to 16, wherein the coating defines a thickness between about 0.5 nanometers and about 50 nanometers.

Clause 18: In some examples, the disclosure describes a bulk magnetic material comprising: a plurality of consolidated nanoparticles, wherein at least one of the plurality of consolidated nanoparticles comprises the nanoparticle of any of clauses 14 to 17.

Clause 19. In some examples, the disclosure describes a system comprising: a source chamber; a deposition chamber; a loadlock chamber; a first sputtering gun at least partially disposed in the source chamber; a second sputtering gun at least partially disposed in the loadlock chamber; and a substrate transfer mechanism operable to move a substrate between the deposition chamber and the loadlock chamber.

Clause 20: The system of clause 19, wherein the first sputtering gun comprises a first target material comprising iron positioned to be impinged upon by a first sputtering gas provided by the first sputtering gun.

Clause 21: The system of clause 20, wherein the first sputtering gas comprises a gaseous mixture of argon and diatomic nitrogen.

Clause 22: The system of any of clauses 19 to 21, wherein the second sputtering gun comprises a second target material comprising at least one of carbon or boron positioned to be impinged upon by a second sputtering gas provided by the second sputtering gun.

Clause 23: The system of any of clauses 19 to 22, further comprising the substrate, wherein the substrate is coupled to the substrate transfer mechanism and receives iron nitride nanoparticles formed using the first sputtering gun.

Clause 24: In some examples, the disclosure describes a method comprising: forming a coating comprising at least one of carbon or boron on a surface of a nanoparticle comprising iron to form a coated iron nanoparticle; and nitriding the coated iron nanoparticle by exposing the coated iron nanoparticle to atomic nitrogen to form a nitride nanoparticle, wherein the nitride nanoparticle comprises at least one $Fe_{16}N_2$ phase domain.

Clause 25: The method of clause 24, wherein forming the coating comprising at least one of carbon or boron on the surface of the nanoparticle comprises forming the coating comprising carbon on the surface of the nanoparticle.

Clause 26: The method of clause 24 or 25, wherein the coated iron nanoparticle further comprises at least one metal dopant, at least one oxide dopant, or both.

Clause 27: The method of clause 26, wherein the at least one metal dopant comprises at least one of a transition metal or a rare earth metal.

Clause 28: The method of clause 26, wherein the at least one oxide dopant comprise at least one of iron oxide, aluminum oxide, or silicon oxide.

Clause 29: The method of any of clauses 24 to 28, wherein the nanoparticle defines a diameter between about 20 nm and about 40 nm.

Clause 30: The method of any of clauses 24 to 29, wherein nitriding the coated iron nanoparticle comprises exposing the nanoparticle to gaseous ammonia.

Clause 31: The method of clause 30, wherein exposing the nanoparticle to gaseous ammonia comprises exposing the nanoparticle to gaseous ammonia at a temperature between about 100° C. and about 200° C. for up to about 1 week.

Clause 32: The method of any of clauses 24 to 31, further comprising, prior to nitriding the coated iron nanoparticle, exposing the coated iron nanoparticle to a reducing gas.

Clause 33: The method of clause 32, wherein the reducing gas comprises hydrogen gas.

Clause 34: The method of clause 32 or 33, wherein exposing the coated iron nanoparticle to the reducing gas comprises exposing the coated iron nanoparticle to the reducing gas at a temperature between about 200° C. and about 500° C. for up to about 10 hours.

Clause 35: The method of any of clauses 24 to 34, wherein the nanoparticle comprises a plurality of nanoparticles.

Clause 36: In some examples, the disclosure describes a system for performing the method of any of clauses 24 to 35.

Clause 37: In some examples, the disclosure describes a nanoparticle formed by the method of any of clauses 24 to 35.

Clause 38: In some examples, the disclosure describes an iron nitride permanent magnet comprising nanoparticles coated with carbon or boron.

Clause 39: The iron nitride permanent magnet of clause 38, wherein the iron nitride permanent magnet comprises at least one $Fe_{16}N_2$ phase domain.

Clause 40: The iron nitride permanent magnet of clause 38, wherein the iron nitride permanent magnet comprises a bulk permanent magnet having a minimum dimension of at least 0.1 mm.

Clause 41: In some examples, the disclosure describes a method comprising: forming a nanoparticle including iron, nitrogen, and between about 0.5 at. % and about 11 at. % of at least one of carbon or boron; and annealing the nanoparticle to form at least one phase domain comprising at least one of $Fe_{16}N_2$, $Fe_{16}(NB)_2$, $Fe_{16}(NC)_2$, or $Fe_{16}(NCB)_2$.

Clause 42: The method of clause 41, wherein forming the nanoparticle including iron, nitrogen, and between about 0.5 at. % and about 11 at. % of at least one of carbon or boron comprises: forming a nanoparticle including iron and nitrogen; and coating a surface of the nanoparticle with at least one of carbon or boron to form a coated nanoparticle.

Clause 43: The method of clause 42, wherein forming the nanoparticle comprises: directing an energized sputtering gas at a target comprising iron to form an iron vapor; forming atomic nitrogen vapor; and condensing iron atoms from the iron vapor and nitrogen atoms from the atomic nitrogen vapor to form the nanoparticle including iron and nitrogen.

Clause 44: The method of clause 43, wherein the sputtering gas comprises argon and diatomic nitrogen, and wherein the atomic nitrogen vapor is formed from the diatomic nitrogen.

Clause 45: The method of any of clauses 42 to 44, wherein the coated nanoparticle comprises a coating including the at least one of carbon or boron, and wherein a thickness of the coating is between about 0.5 nanometers and about 50 nanometers.

Clause 46: The method of any of clauses 42 to 45, wherein annealing the coated nanoparticle to form the at least one $Fe_{16}N_2$ phase domain comprises annealing the coated nanoparticle to form the at least one $Fe_{16}N_2$ phase domain at a temperature between about 150° C. and about 250° C. for between about 20 hours and 48 hours.

Clause 47: The method of clause 42, wherein forming the nanoparticle including iron, nitrogen, and between about 0.5 at. % and about 11 at. % of at least one of carbon or boron comprises: forming a coating comprising at least one of carbon or boron on a surface of a nanoparticle comprising iron to form a coated iron nanoparticle; and nitriding the coated iron nanoparticle by exposing the coated iron nanoparticle to atomic nitrogen.

Clause 48: The method of clause 47, wherein the coated iron nanoparticle further comprises at least one metal dopant, at least one oxide dopant, or both.

Clause 49: The method of clause 48, wherein the at least one metal dopant comprises at least one of a transition metal or a rare earth metal.

Clause 50: The method of clause 48, wherein the at least one oxide dopant comprise at least one of iron oxide, aluminum oxide, or silicon oxide.

Clause 51: The method of any of clauses 47 to 50, wherein nitriding the coated iron nanoparticle comprises exposing the nanoparticle to gaseous ammonia.

Clause 52: The method of clause 51, wherein exposing the nanoparticle to gaseous ammonia comprises exposing the nanoparticle to gaseous ammonia at a temperature between about 100° C. and about 200° C. for up to about 1 week.

Clause 53: The method of any of clauses 47 to 62, further comprising, prior to nitriding the coated iron nanoparticle, exposing the coated iron nanoparticle to hydrogen.

Clause 54: In some examples, the disclosure describes a system for performing the method of any of clauses 42 to 53.

Clause 55: In some examples, the disclosure describes a nanoparticle formed by the method of any of clauses 42 to 53.

Clause 56: In some examples, the disclosure describes a bulk permanent magnet comprising a plurality of nanoparticles formed by the method of any of clauses 42 to 53, wherein a minimum dimension of the bulk permanent magnet is at least 0.1 mm.

EXAMPLES

Example 1

The system illustrated in FIG. 1 was used to prepare iron nitride particles coated with carbon. The base pressure of system 10 was below $1\times10^{-7}$ Torr. Fe targets with 99.99 at % purity were used as the sputtering target 18, and a sputtering gas including a mixture of 99 at. % argon and 1 at. % nitrogen was used as. The sputtering gas was injected into the source chamber 12 and a gas flow was formed flying from source chamber 12 to deposition chamber 14. During fabrication, $N_2$ molecules were split into active nitrogen atoms by high energy argon ions and electrons. At the same time, Fe atoms were knocked out of the target 18 by the bombardment of high energy argon ions. As a result, a vapor mixture of Fe and N atoms was formed in the proximity of Fe target 18. The Fe atoms condensed together with the N atoms to form iron nitride nanoparticles. The formed iron nitride nanoparticles were carried by gas flow and travel from the source chamber 12 to the deposition chamber 14. The iron nitride nanoparticles deposited on substrate 26. Based on this synthesis process, the composition of the FeN nanoparticles was precisely controlled by adjusting the percentage of $N_2$ in the sputtering gas. The sputtering current and pressure were fixed at between about 0.2 A and about 0.7 A and between about 200 mTorr and about 500 mTorr, respectively.

Carbon deposition was followed in the same system, with carbon target 36 having a 99.99 at. % purity. Highly pure argon was used as the sputtering gas. The flow rate of the sputtering gas was between about 20 standard cubic centimeter per minute (sccm) and about 50 sccm. The sputtering current was between about 0.2 A and about 0.7 A while the pressure was between about 200 mTorr and about 500 mTorr.

After formation of the carbon-coated iron nitride nanoparticles, the carbon-coated iron nitride nanoparticles were annealed at a temperature between about 150° C. and about 250° C. for between about 20 hours and about 48 hours in a vacuum chamber with a base pressure below $5\times10^{-8}$ Torr.

Figure 2:
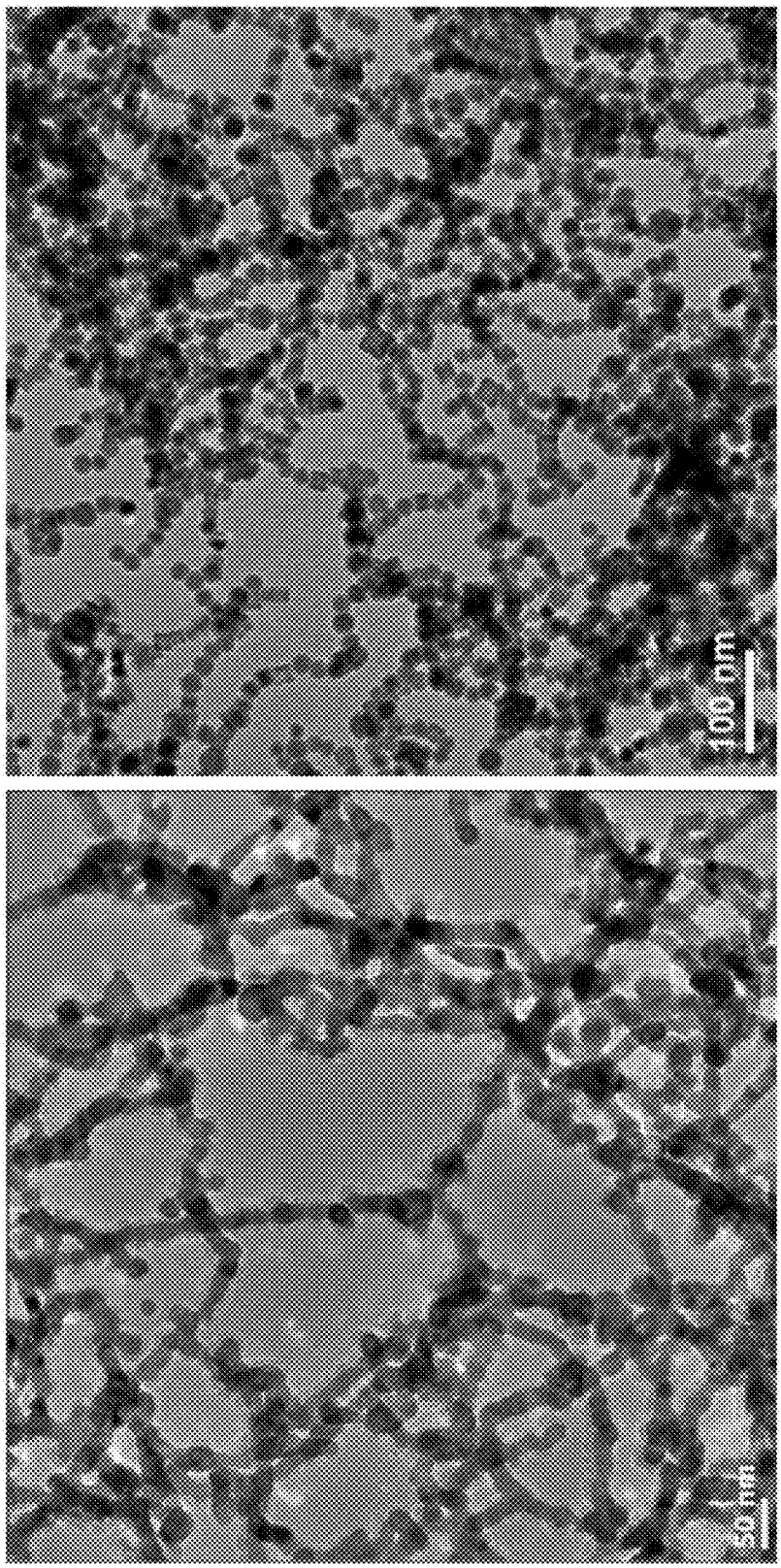
FIGS. 2A and 2B show TEM images of sample nanoparticles with and without carbon deposition, respectively.
Figure 3:
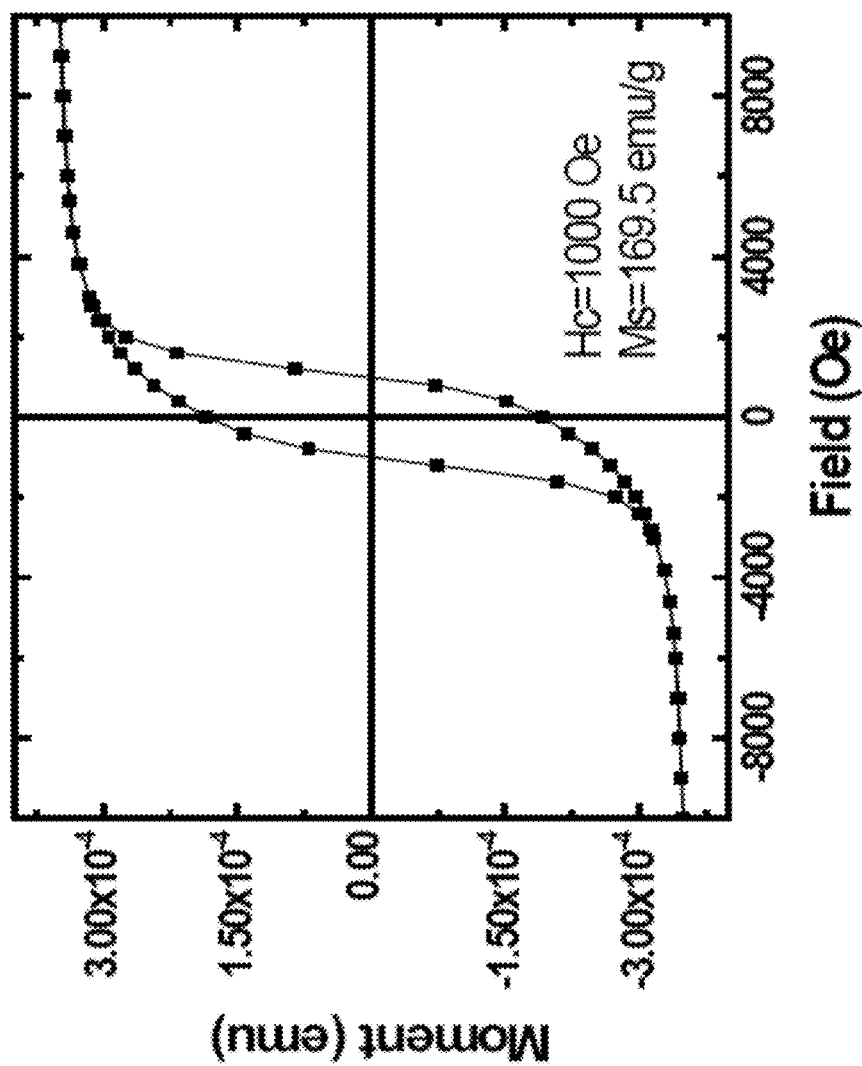
FIG. 3 is a diagram illustrating a hysteresis loop of magnetic moment versus applied magnetic field of a sample including carbon-coated iron nitride nanoparticles.
Figure 4:
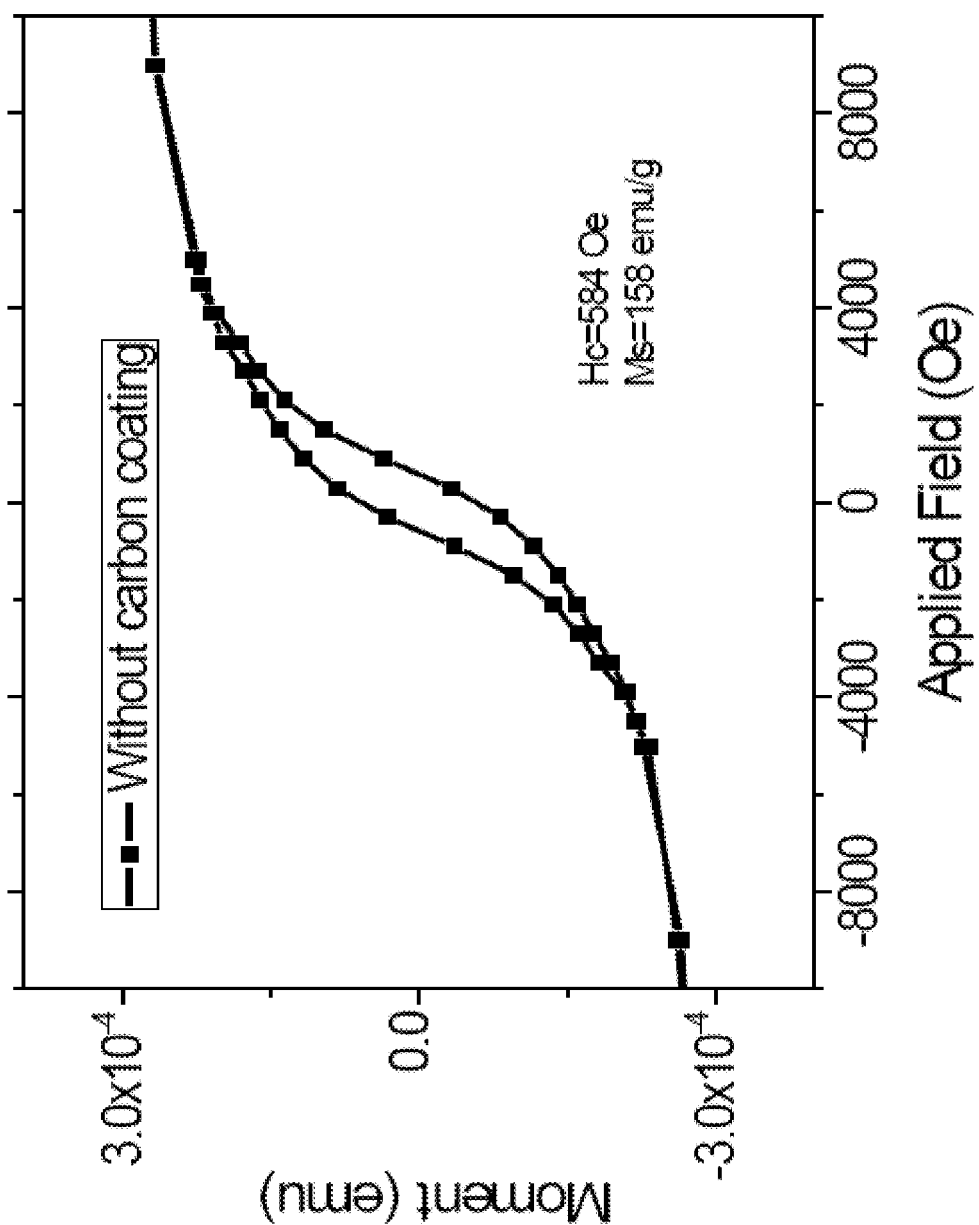
FIG. 4 is a diagram illustrating a hysteresis loop of magnetic moment versus applied magnetic field for a sample including uncoated iron nitride nanoparticles.

Transmission Electron Microscopy (TEM) was used to characterize the obtained nanoparticles. FIGS. 2A and 2B show TEM images of sample nanoparticles with and without carbon deposition, respectively. For the sample without carbon deposition, its nanoparticles are distributed substantially homogeneous and separately. Without carbon deposition, the coercivity of the nanoparticles was about 200 Oe. For the sample with carbon deposition, as shown in FIG. 2A, after annealing, the nanoparticles were deformed and combined with each other to from unified strings. The coercivity of the sample with carbon-coated nanoparticles was about 1000 Oe. FIG. 3 shows the hysteresis loop of magnetic moment versus applied magnetic field of the sample including carbon-coated nanoparticles. FIG. 4 shows the hysteresis loop of magnetic moment versus applied magnetic field for the sample including uncoated nanoparticles.

Figures 5A, 5B:
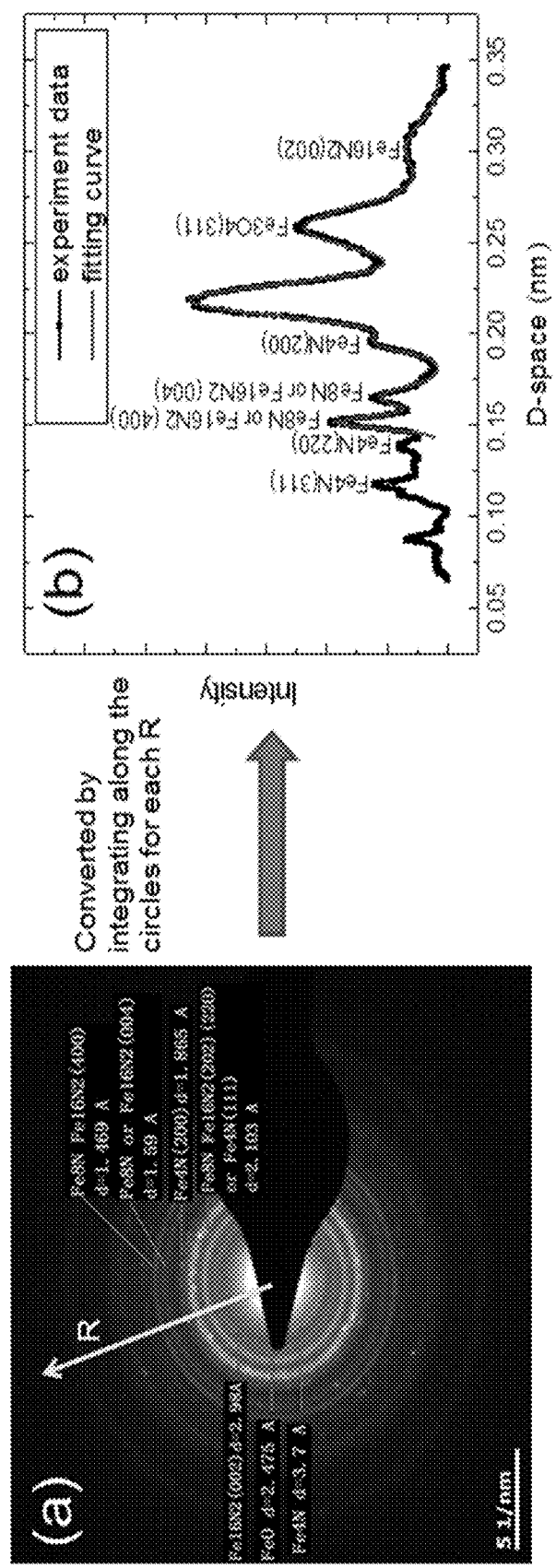
FIG. 5A is an example XRD image for the sample including carbon-coated nanoparticles.
FIG. 5B is an example plot of intensity versus D-space generated from the XRD image of FIG. 5A.

The volume ratio of $Fe_{16}N_2/Fe_8N$ phase was estimated for the sample including carbon-coated nanoparticles. FIG. 5A is an example XRD image for the sample including carbon-coated nanoparticles. FIG. 5B is an example plot of intensity versus D-space generated from the XRD image of FIG. 5A. The peak intensities for $Fe_{16}N_2$ and $Fe_8N$, $Fe_4N$, and $Fe_3O_4$ were determined by integrating the respective circles for each radius. The results of the integrations are shown in Table 1.

TABLE 1

|  | $Fe_{16}N_2$ and $Fe_8N$ (202) | $Fe_4N$ (111) | $Fe_3O_4$ (311) |
|---|---|---|---|
| Peak intensity | 2138 | 309 | 540 |
| Volume ratio | 66% | 11.6% | 22.4% |

The volume ratio of $Fe_{16}N_2$ and $Fe_8N$, $Fe_4N$, and $Fe_3O_4$ were then determined by determining the ratio of the peak intensities. The volume ratio of $Fe_{16}N_2$ and $Fe_8N$ was estimated to be 66% for the carbon-coated nanoparticles.

The surface coverage of $Fe_{16}N_2/Fe_8N$ was estimated to be about 77.6% based on the TEM image shown in FIG. 2A, and the saturation magnetization of the sample was estimated to be 170 emu/g based on the hysteresis loop. To make a comparison, FIG. 4 shows the hysteresis loop of magnetic moment versus applied magnetic field for a sample including iron nitride particles without a carbon coating. For the sample including uncoated iron nitride particles, the coercivity was about 584 Oe and the saturation magnetization was estimated to be 158 emu/g with 82% coverage based on the TEM image shown in FIG. 2B.

Example 2

Figure 6:
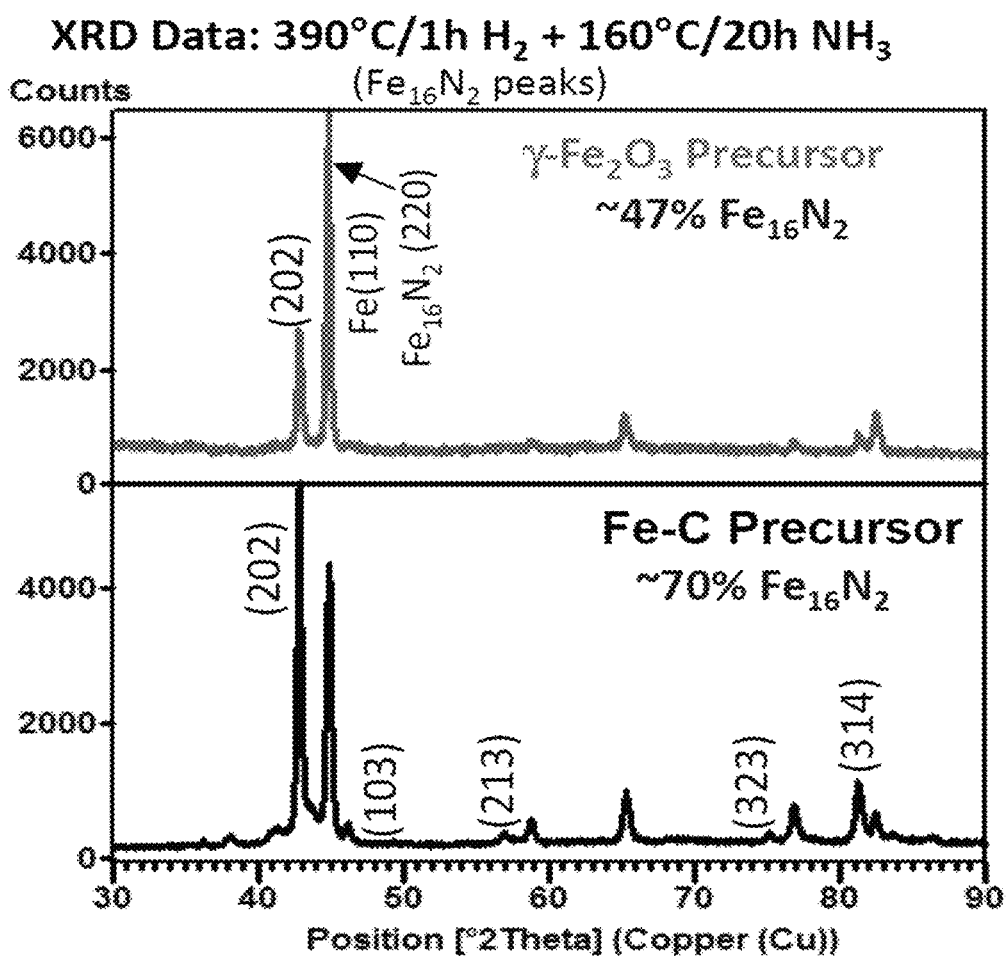
FIG. 6 is a diagram illustrating x-ray diffraction data for example nitridized nanoparticles.

A $\gamma\text{-}Fe_2O_3$ precursor powder with nanoparticle diameters between about 20 nm and about 40 nm and a surface area of between about 30 $m^2/g$ and about 60 $m^2/g$ was reduced at a temperature of about 390° C. for about 1 hour in substantially pure $H_2$. The $\gamma\text{-}Fe_2O_3$ precursor powder is available from Alfa Aesar, Ward Hill, Mass. The reduced iron nanoparticles were then nitrided at a temperature of about 160° C. for about 20 hours in an atmosphere of substantially pure gaseous $NH_3$. FIG. 6 is a diagram illustrating x-ray diffraction data for the nitrided nanoparticles.

A passivated (includes oxygen) Fe—C precursor powder with nanoparticle diameters of about 25 nm and a surface area of between about 40 $m^2/g$ and about 60 $m^2/g$ was reduced at a temperature of about 390° C. for about 1 hour in substantially pure $H_2$. The Fe—C precursor powder is reported to contain nominal C levels of about 8.66 weight percent (wt. %) and nominal 0 levels of about 10 wt. %. The reduced Fe—C nanoparticles were then nitrided at a temperature of about 160° C. for about 20 hours in an atmosphere of substantially pure gaseous $NH_3$. FIG. 6 is a diagram illustrating x-ray diffraction data for the nitrided nanoparticles. The top diagram in FIG. 5 illustrates the x-ray diffraction data for the nitrided $\gamma\text{-}Fe_2O_3$ nanoparticles. The bottom diagram in FIG. 5 illustrates the x-ray diffraction data for the nitrided Fe—C nanoparticles. The $Fe_{16}N_2$ phase yield for the $\gamma\text{-}Fe_2O_3$ precursor powder was about 47% under these conditions, compared with about 70% $Fe_{16}N_2$ phase yield using the Fe—C precursor nanoparticles. Tables 2 and 3 list the estimated phase percentages for various phases in the nitrided nanoparticles.

TABLE 2

Phase percentages for $\gamma\text{-}Fe_2O_3$ precursor powder

| Phase | Percentage (%) |
|---|---|
| $Fe_{16}N_2$ | 47 |
| Fe | 47 |
| $Fe_3O_4$ | 1 |

TABLE 2-continued

Phase percentages for γ-Fe$_2$O$_3$ precursor powder

| Phase | Percentage (%) |
|---|---|
| Fe$_4$N | 5 |
| Fe$_3$N | 0 |

TABLE 3

Phase percentages for Fe—C precursor powder

| Phase | Percentage (%) |
|---|---|
| Fe$_{16}$N$_2$ | 71 |
| Fe | 17 |
| Fe$_3$O$_4$ | 0 |
| Fe$_4$N | 4 |
| Fe$_3$N/Fe$_3$C | 8 |

Figure 7:
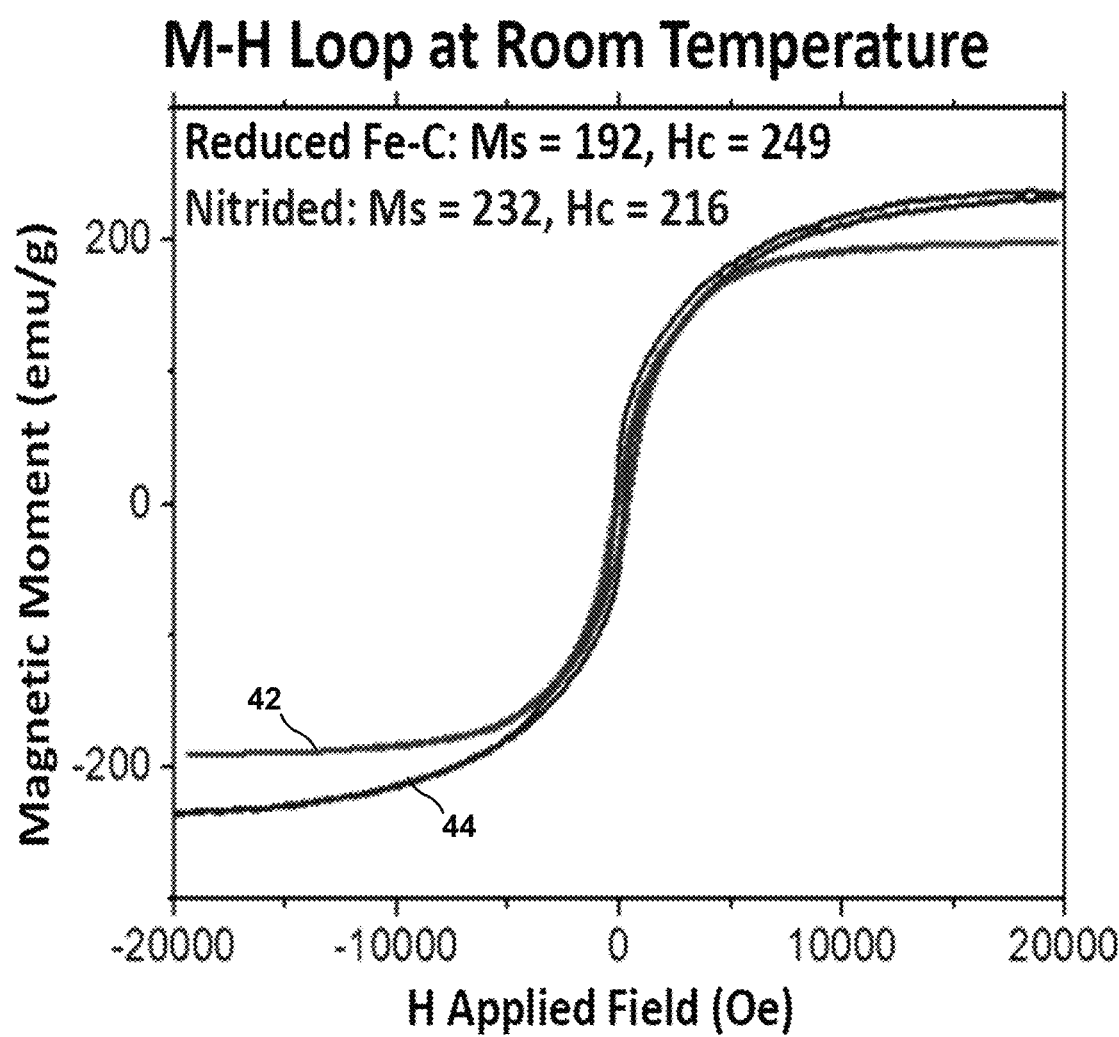
FIG. 7 is a diagram illustrating hysteresis loops of magnetization versus applied magnetic field at room temperature for example Fe—C precursor nanoparticles after $H_2$ reduction and after $NH_3$ nitridation.

FIG. 7 is a diagram illustrating hysteresis loops of magnetization versus applied magnetic field at room temperature for Fe—C precursor nanoparticles after H$_2$ reduction and after NH$_3$ nitridation. As shown in FIG. 7, after H$_2$ reduction, the Fe—C precursor nanoparticles (curve 42) reached a magnetization value of about 192 emu/gram at a field of 20 kOe and a coercivity of about 249 Oe. After nitridation, the nitrided powder (curve 44) reached a magnetization value of about 232 emu/gram at a field of 20 kOe and a coercivity of about 216 Oe. For comparison, the Fe$_{16}$N$_2$ containing nanoparticles derived from γ-Fe$_2$O$_3$ nanoparticles exhibited a magnetization of only 207 emu/gram at room temperature, only marginally exceeding the nominal value of 200 emu/g for pure iron.

Figure 8:
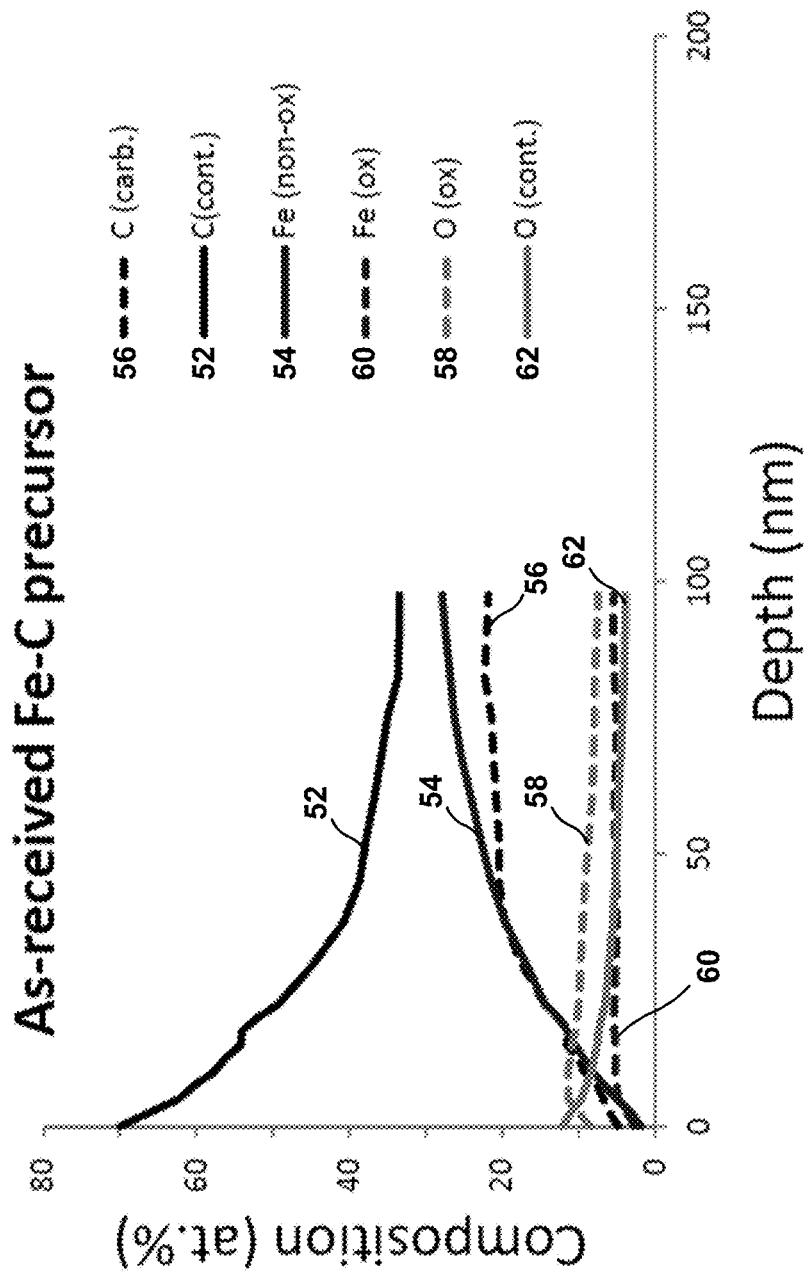
FIGS. 8 and 9 are diagrams illustrating composition as a function of depth of example Fe—C precursor nanoparticles and example nanoparticles including $Fe_{16}N_2$ derived from the Fe—C precursor nanoparticles, respectively.
Figure 9:
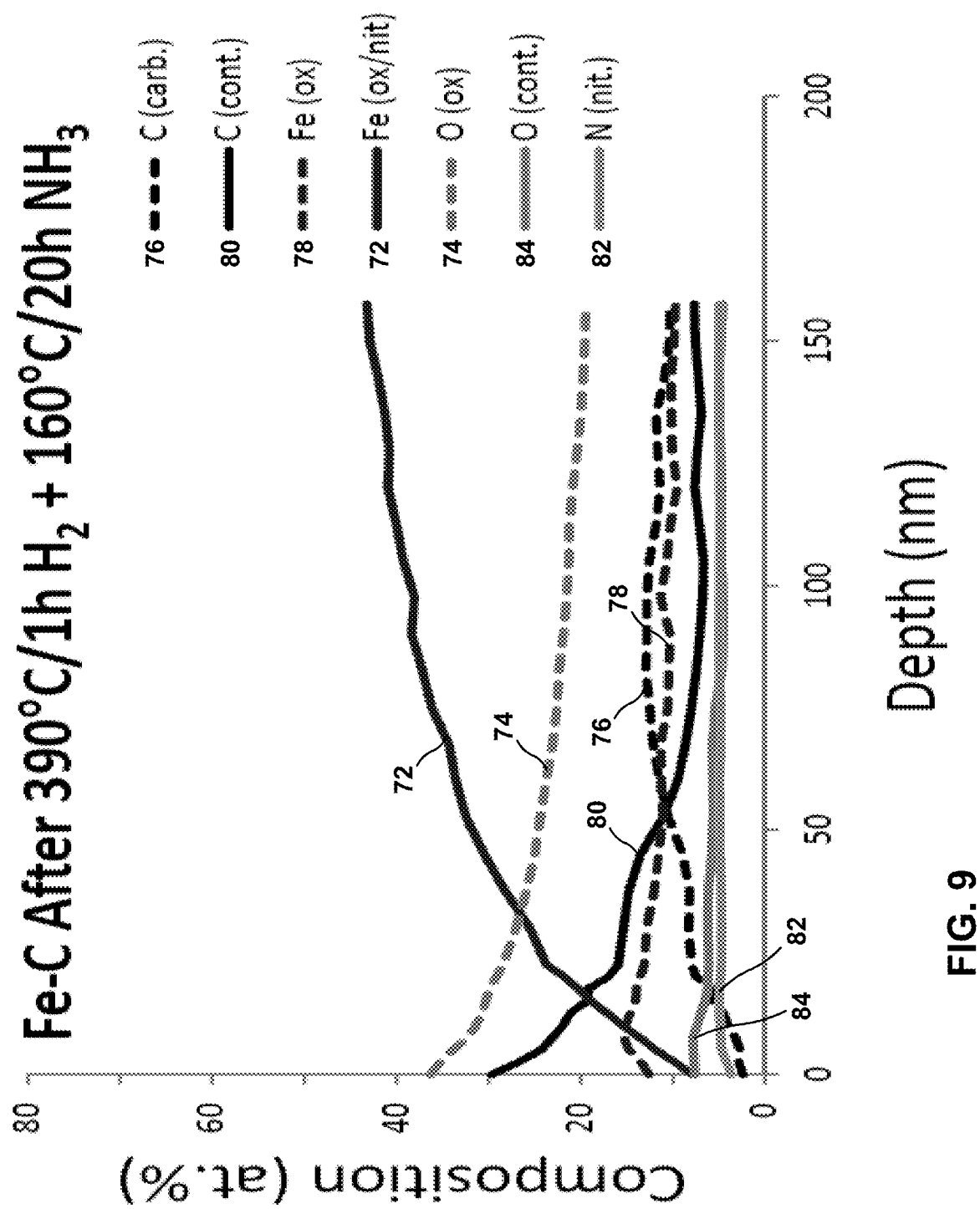

Tables 4 and 5 present results powder analysis by bulk combustion technique for C and N content. FIGS. 8 and 9 are diagrams illustrating composition as a function of depth of the Fe—C precursor nanoparticles and the nanoparticles including Fe$_{16}$N$_2$ derived from the Fe—C precursor nanoparticles. The composition data in FIGS. 8 and 9 was measured using x-ray photoelectron spectroscopy (XPS) sputtering techniques. The XPS technique was based on sputtering into a range of agglomerated reaction powders to a depth at which the composition profiles leveled out. FIGS. 10A and 10B are micrographs illustrating a plurality of nanoparticles including Fe$_{16}$N$_2$ phase and a magnified view of a single nanoparticles including Fe$_{16}$N$_2$ phase. As shown in FIG. 10A, the nitrided powders had a range of particle sizes, such that the XPS sputtering data presented in FIGS. 8 and 9 should be considered semi-quantitative rather than quantitative, as it is effectively averaged over particle surfaces and interiors. Significant C is retained in the resultant nitrided powders, with TEM data indicating a graphitic carbon coating was retained (FIG. 10B) and XPS data suggesting both nitride and carbide bonding. These features may contribute to the relatively high Fe$_{16}$N$_2$ phase yield and magnetization values, and suggest the possibility of both nitride and carbon-nitride formation. Such formation is consistent with similarities in the Fe—C and Fe—N system, particularly with regards to both C and N resulting in Fe martensite formation (Fe$_8$N disordered is essentially a martensitic phase). The XPS data shown in FIGS. 8 and 9 also indicate that significant oxygen was present in the nitrided nanoparticles. This oxygen may aid stability of the nanoparticles in air. The conversion between weight percent and atomic percent in Table 4 is based on the assumption that the precursor and nanoparticles include only iron, carbon, and nitrogen.

TABLE 4

Powder composition analysis by combustion technique

| Material | C content wt. % (at. %) | N content wt. % (at. %) |
|---|---|---|
| Fe—C precursor | 4.94 (19.35) | <0.023 (<0.77) |
| Nitrided nanoparticles | 1.3 (5.34) | 2.82 (9.94) |

TABLE 5

Powder composition analysis by x-ray photoelectron spectroscopy technique

| Material | C content at. % | N content at. % | O content at. % |
|---|---|---|---|
| Fe—C precursor | 46.6 | — | 16.2 |
| Nitrided nanoparticles | 18.7 | 5.0 | 23.2 |

Various examples have been described. These and other examples are within the scope of the following claims.

What is claimed is:

1. A method comprising:
   directing an energized sputtering gas at a target comprising iron to form an iron vapor, wherein the energized sputtering gas comprises argon and diatomic nitrogen;
   forming atomic nitrogen vapor from the diatomic nitrogen;
   condensing iron atoms from the iron vapor and nitrogen atoms from the atomic nitrogen vapor to form a nanoparticle including iron and nitrogen;
   coating a surface of the nanoparticle including iron and nitrogen with at least one of carbon or boron to form a coated nanoparticle wherein a thickness of a coating of the coated nanoparticle is between about 0.5 nanometers and about 50 nanometers, and wherein the nanoparticle defines a diameter between about 0.5 nm and about 200 nm; and
   nitriding the nanoparticle to form the nanoparticle including iron, nitrogen, and at least one of carbon or boron; and
   annealing the nanoparticle to form a permanent magnet comprising at least one Fe$_{16}$N$_2$ phase domain
   wherein the nanoparticle comprises an oxide dopant.

2. The method of claim 1, wherein coating the surface of the nanoparticle including iron and nitrogen with at least one of carbon or boron comprises:
   directing an energized sputtering gas at a target comprising the at least one of carbon or boron to form a vapor comprising atoms of the at least one of carbon or boron; and
   condensing the atoms of the at least one of carbon or boron from the vapor to coat the surface of the nanoparticle including iron and nitrogen with at least one of carbon or boron.

3. The method of claim 1, wherein the nanoparticle including iron and nitrogen further comprises at least one of iron nitride, iron carbide, iron boride, or iron carbo-boride.

4. The method of claim 1, wherein forming the nanoparticle including iron and at least one of carbon or boron comprises:
   forming a coating comprising at least one of carbon or boron on a surface of a nanoparticle comprising iron to form a coated nanoparticle.

5. The method of claim 4, wherein forming the coating comprising at least one of carbon or boron on the surface of the nanoparticle comprising iron to form the coated nanoparticle comprises:
- directing an energized sputtering gas at a target comprising the at least one of carbon or boron to form a vapor comprising atoms of the at least one of carbon or boron; and
- condensing the atoms of the at least one of carbon or boron from the vapor to coat the surface of the nanoparticle including iron with at least one of carbon or boron.

6. The method of claim 4, wherein a thickness of the coating is between about 0.5 nanometers and about 50 nanometers, and wherein the nanoparticle defines a diameter between about 0.5 nm and about 200 nm.

7. The method of claim 1, wherein the nanoparticle including iron and at least one of carbon or boron further comprises at least one of iron nitride, iron carbide, iron boride, or iron carbo-boride.

8. The method of claim 1, wherein nitriding the coated nanoparticle comprises exposing the coated nanoparticle to gaseous ammonia at a temperature between about 100° C. and about 200° C. for up to about 1 week.

9. The method of claim 1, wherein annealing the nanoparticle to form the at least one $Fe_{16}N_2$ phase domain comprises annealing the nanoparticle at a temperature between about 150° C. and about 250° C. for between about 20 hours and 48 hours.

10. The method of claim 1, wherein the nanoparticle including iron, nitrogen, and at least one of carbon or boron comprises between about 0.5 at. % and about 11 at. % of the at least one of carbon or boron.

11. The method of claim 1, wherein annealing the nanoparticle to form at least one $Fe_{16}N_2$ phase domain also forms at least one phase domain comprising at least one of $Fe_{16}(NB)_2$, $Fe_{16}(NC)_2$, or $Fe_{16}(NCB)_2$.

12. A method comprising:
- directing an energized sputtering gas at a target comprising iron to form an iron vapor, wherein the energized sputtering gas comprises argon and diatomic nitrogen;
- forming atomic nitrogen vapor from the diatomic nitrogen;
- condensing iron atoms from the iron vapor and nitrogen atoms from the atomic nitrogen vapor to form a nanoparticle including iron and nitrogen;
- coating a surface of the nanoparticle including iron and nitrogen with at least one of carbon or boron to form a coated nanoparticle; and
- wherein the nanoparticle includes between about 0.5 at. % and about 11 at. % of at least one of carbon or boron;
- wherein a thickness of a coating of the coated nanoparticle is between about 0.5 nanometers and about 50 nanometers, and wherein the nanoparticle defines a diameter between about 0.5 nm and about 200 nm, and
- annealing the coated nanoparticle to form a permanent magnet comprising at least one phase domain comprising at least one of $Fe_{16}N_2$, $Fe_{16}(NB)_2$, $Fe_{16}(NC)_2$, or $Fe_{16}(NCB)_2$
- wherein the coated nanoparticle comprises an oxide dopant.

13. The method of claim 12, wherein annealing the coated nanoparticle to form the at least one $Fe_{16}N_2$ phase domain comprises annealing the coated nanoparticle to form the at least one $Fe_{16}N_2$ phase domain at a temperature between about 150° C. and about 250° C. for between about 20 hours and 48 hours.

14. The method of claim 12, wherein nitriding the coated nanoparticle comprises exposing the nanoparticle to gaseous ammonia at a temperature between about 100° C. and about 200° C. for up to about 1 week.

15. The method of claim 12, wherein the nanoparticle including iron, nitrogen, and between about 0.5 at. % and about 11 at. % of at least one of carbon or boron further comprises at least one of iron carbide, iron boride, or iron carbo-boride.

* * * * *